United States Patent
Asaoka et al.

(10) Patent No.: US 12,279,503 B2
(45) Date of Patent: Apr. 15, 2025

(54) DISPLAY DEVICE AND METHOD OF MANUFACTURING DISPLAY DEVICE

(71) Applicant: SHARP KABUSHIKI KAISHA, Sakai (JP)

(72) Inventors: Yasushi Asaoka, Sakai (JP); Sentaro Kida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 648 days.

(21) Appl. No.: 17/622,131

(22) PCT Filed: Aug. 5, 2019

(86) PCT No.: PCT/JP2019/030638
§ 371 (c)(1),
(2) Date: Dec. 22, 2021

(87) PCT Pub. No.: WO2021/024337
PCT Pub. Date: Feb. 11, 2021

(65) Prior Publication Data
US 2022/0352262 A1    Nov. 3, 2022

(51) Int. Cl.
*H01L 27/32*    (2006.01)
*H01L 51/52*    (2006.01)
(Continued)

(52) U.S. Cl.
CPC .......... *H10K 59/353* (2023.02); *H10K 50/14* (2023.02); *H10K 50/841* (2023.02);
(Continued)

(58) Field of Classification Search
CPC .. H10K 59/00; H10K 59/131; H10K 59/1315; H10K 59/179; H10K 59/1795;
(Continued)

(56) References Cited

U.S. PATENT DOCUMENTS

2007/0108899 A1*  5/2007  Jung .................... H10K 59/805
                                                    313/506
2008/0001864 A1*  1/2008  Lee .................... H10K 59/8722
                                                    345/82
(Continued)

FOREIGN PATENT DOCUMENTS

JP    2012-533156 A    12/2012
JP    2016-164855 A     9/2016
(Continued)

OTHER PUBLICATIONS

International Searching Authority, Translation, Written Opinion of International Searching Authority, International application No. PCT/JP2019/030638, Feb. 5, 2022, all pages. (Year: 2022).*
(Continued)

*Primary Examiner* — Victoria K. Hall
(74) *Attorney, Agent, or Firm* — ScienBiziP, P.C.

(57) ABSTRACT

The provided method of manufacturing a display device includes a nanoparticle layer forming step and a bonding step. The nanoparticle layer forming step includes forming a nanoparticle layer including a stack of nanoparticles on either one or both of a topmost face of a first substrate including first electrodes, the first electrodes being provided on said topmost face, and a topmost face of a second substrate including a second electrode, the second electrode being provided on said topmost face. The bonding step includes bonding the first substrate and the second substrate together via the nanoparticle layer in such a manner that the first electrodes face the second electrode.

18 Claims, 21 Drawing Sheets

(51) Int. Cl.
   *H01L 51/56* (2006.01)
   *H10K 50/14* (2023.01)
   *H10K 50/84* (2023.01)
   *H10K 59/35* (2023.01)
   *H10K 59/80* (2023.01)
   *H10K 71/00* (2023.01)
   *H10K 71/50* (2023.01)
   *H10K 71/60* (2023.01)
   *H10K 102/00* (2023.01)

(52) U.S. Cl.
   CPC ........... *H10K 59/871* (2023.02); *H10K 71/00* (2023.02); *H10K 71/50* (2023.02); *H10K 71/60* (2023.02); *H10K 2102/331* (2023.02)

(58) Field of Classification Search
   CPC ... H10K 59/8052–80524; H10K 59/82; H10K 59/87–8723; H10K 50/82–828; H10K 50/84–8428; H10K 71/50; H10K 71/60
   See application file for complete search history.

(56) References Cited

U.S. PATENT DOCUMENTS

| | | | |
|---|---|---|---|
| 2011/0303930 A1* | 12/2011 | Bang | H10K 50/824 257/91 |
| 2012/0138894 A1 | 6/2012 | Qian et al. | |
| 2017/0221969 A1* | 8/2017 | Steckel | H10K 59/32 |
| 2017/0271605 A1* | 9/2017 | Steckel | H10K 50/115 |
| 2017/0279084 A1 | 9/2017 | Sakamoto et al. | |
| 2017/0293170 A1 | 10/2017 | Miyawaki et al. | |
| 2018/0019371 A1* | 1/2018 | Steckel | H01L 27/1225 |
| 2018/0062101 A1* | 3/2018 | Li | H10K 50/11 |
| 2018/0102093 A1* | 4/2018 | Kim | H01L 33/06 |
| 2018/0182828 A1 | 6/2018 | Kim | |
| 2018/0374409 A1* | 12/2018 | Lee | G09G 3/3225 |
| 2019/0157354 A1* | 5/2019 | Lee | H10K 59/351 |
| 2019/0393276 A1 | 12/2019 | Kim | |
| 2020/0044173 A1* | 2/2020 | Kim | H10K 50/844 |

FOREIGN PATENT DOCUMENTS

| | | |
|---|---|---|
| JP | 2017-174553 A | 9/2017 |
| JP | 2017-191154 A | 10/2017 |
| JP | 2018-110118 A | 7/2018 |

OTHER PUBLICATIONS

International Searching Authority, International Search Report, International application No. PCT/JP2019/030638, Feb. 11, 2021, all pages. (Year: 2021).*

* cited by examiner

DISPLAY DEVICE AND METHOD OF MANUFACTURING DISPLAY DEVICE

TECHNICAL FIELD

The disclosure relates to display devices including light-emitting elements and also to methods of manufacturing such display devices.

BACKGROUND ART

Patent Literature 1 discloses a top-emission display device.

CITATION LIST

Patent Literature

Patent Literature 1: Japanese Unexamined Patent Application Publication, Tokukai, No. 2016-164855

SUMMARY

Technical Problem

The display device described in Patent Literature 1 may be manufactured by forming a functional layer containing a light-emitting layer divided for individual subpixels and subsequently forming electrodes on the functional layer by sputtering. This formation of the electrodes directly on the functional layer by sputtering, however, can damage the functional layer.

Solution to Problem

The disclosure, to address this issue, is directed to a display device including: a plurality of subpixels; and light-emitting elements, one for each of the plurality of subpixels, wherein the light-emitting elements include: a first substrate including first electrodes, one for each of the plurality of subpixels; a second substrate including a second electrode common to the plurality of subpixels; subpixel-specific layers, one for each of the plurality of subpixels, between the first electrodes and the second electrode; and a nanoparticle layer between the first electrodes and the second electrode, the nanoparticle layer including a stack of nanoparticles, wherein there is provided a cavity between each adjacent pair of the subpixel-specific layers, between the first substrate and the second substrate.

The disclosure, to address the issue, is further directed to a display device including: a plurality of subpixels; and light-emitting elements, one for each of the plurality of subpixels, wherein the light-emitting elements include: first electrodes, one for each of the plurality of subpixels; a second electrode common to the plurality of subpixels; subpixel-specific layers, one for each of the plurality of subpixels, between the first electrodes and the second electrode; and a nanoparticle layer between the first electrodes and the second electrode, the nanoparticle layer including a stack of nanoparticles, wherein the nanoparticles have an average density that is higher in locations that overlap the subpixel-specific layers than in locations that overlap gaps between adjacent pairs of the subpixel-specific layers in the nanoparticle layer.

The disclosure, to address the issue, is further directed to a display device including: a plurality of subpixels; and light-emitting elements, one for each of the plurality of subpixels, wherein the light-emitting elements include: first electrodes, one for each of the plurality of subpixels; a second electrode common to the plurality of subpixels; subpixel-specific layers, one for each of the plurality of subpixels, between the first electrodes and the second electrode; a nanoparticle layer between the first electrodes and the second electrode, the nanoparticle layer including a stack of nanoparticles; and a sealing member between the first electrodes and the second electrode, the sealing member overlapping a part of the second electrode and adhering to the second electrode.

The disclosure, to address the issue, is further directed to a display device including: a plurality of subpixels; light-emitting elements, one for each of the plurality of subpixels; a first substrate including first electrodes, one for each of the plurality of subpixels; a second substrate opposite the first substrate, the second substrate including a second electrode common to the plurality of subpixels, either one or both of the first substrate and the second substrate including subpixel-specific layers, one for each of the plurality of subpixels, and either one or both of the first substrate and the second substrate including lumps in locations that overlap the first electrodes, the lumps projecting toward the opposite substrate; and a nanoparticle layer in locations that overlap the lumps, the nanoparticle layer including a stack of nanoparticles and being in contact with both the first substrate and the second substrate.

The disclosure, to address the issue, is directed to a method of manufacturing a display device including: a plurality of subpixels; and light-emitting elements, one for each of the plurality of subpixels, the method including: the first substrate preparation step of preparing a first substrate including insular, first electrodes, one for each of the plurality of subpixels; the second substrate preparation step of preparing a second substrate including a second electrode; the subpixel-specific layer forming step of forming insular subpixel-specific layers, one for each of the first electrodes, on either one or both of a top face of the first substrate on which the first electrodes are provided and a top face of the second substrate on which the second electrode is provided; the nanoparticle layer forming step of forming a nanoparticle layer including a stack of nanoparticles on either one or both of the topmost face of the first substrate on which the first electrodes are provided and the topmost face of the second electrode on which the second electrode is provided; and the bonding step of bonding the first substrate and the second substrate together via the nanoparticle layer in such a manner that the first electrodes face the second electrode.

Advantageous Effects of Disclosure

These structures and method do not cause damage to the subpixel-specific layers in the display device when the second electrode is formed. The structures therefore can improve yield in the manufacture of the display device.

DESCRIPTION OF EMBODIMENTS

Embodiment 1

Figure 1:
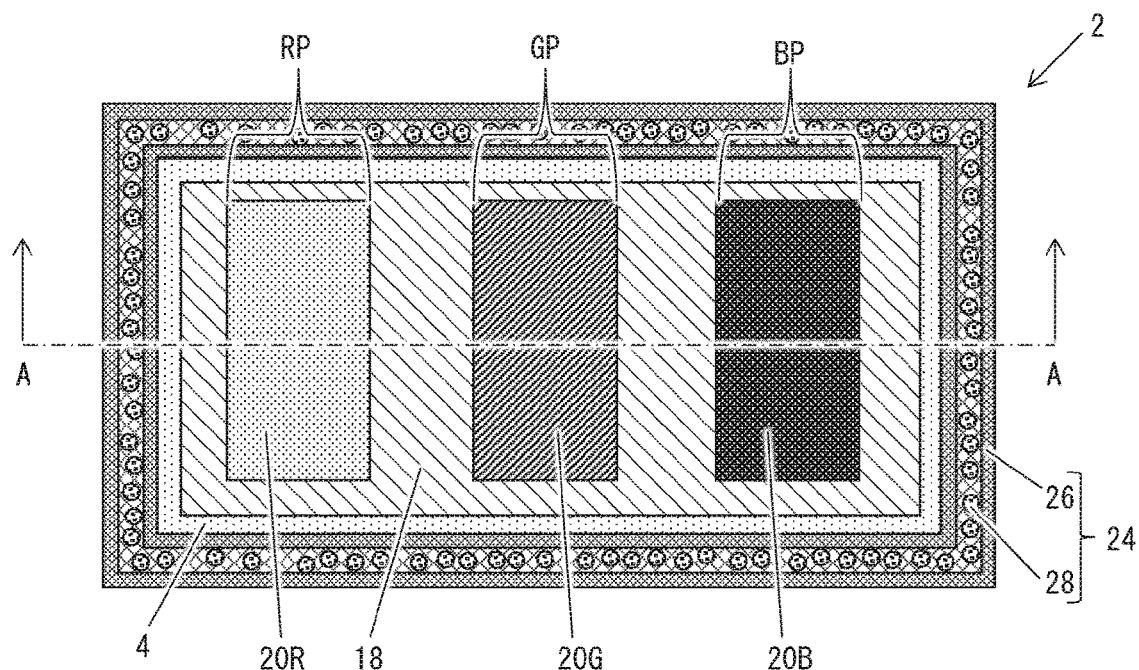
FIG. 1 is a schematic top view of a display device in accordance with Embodiment 1.
Figure 2:
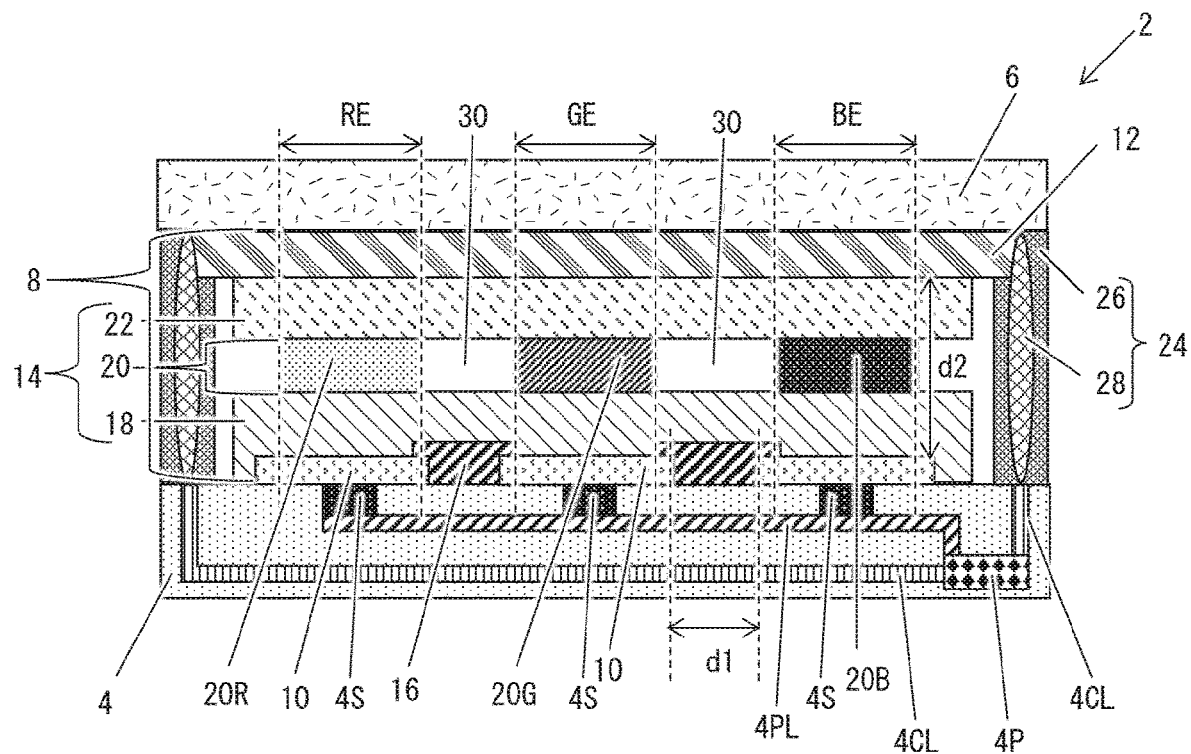
FIG. 2 is a schematic cross-sectional view of the display device in accordance with Embodiment 1.

FIGS. 1 and 2 are schematic views of a display device 2 in accordance with the present embodiment. FIG. 1 is a top view, and FIG. 2 is a cross-sectional view. For convenience of illustration, FIG. 1 shows no second substrate 6, no second electrode 12, and no second charge transport layer 22. These members will be detailed later. FIG. 2 is a cross-sectional view taken along line A-A shown in FIG. 1.

The display device 2 in accordance with the present embodiment includes a plurality of subpixels. The display device 2 includes, for example, red pixels RP, green pixels GP, and blue pixels BP as subpixels as shown in FIG. 1. FIG. 1 shows the display device 2 including one red pixel RP, one green pixel GP, and one blue pixel BP for convenience of illustration. The display device 2 may alternatively include a plurality of pixels each including one red pixel RP, one green pixel GP, and one blue pixel BP.

The display device 2 includes a first substrate 4, a second substrate 6, and a light-emitting element layer 8 as shown in FIG. 2. The first substrate 4 and the second substrate 6 are placed facing each other across the light-emitting element layer 8.

The light-emitting element layer 8 includes first electrodes 10 on the top face of the first substrate 4, a second electrode 12 on the bottom face of the second substrate 6, and a functional layer 14 between the first electrodes 10 and the second electrode 12.

In the present embodiment, the display device 2 includes a light-emitting element in each subpixel in the light-emitting element layer 8, that is, inside a gap between the first electrodes 10 and the second electrode 12. The display device 2 in accordance with the present embodiment includes a red light-emitting element RE in a red subpixel RP, a green light-emitting element GE in a green subpixel GP, and a blue light-emitting element BE in a blue subpixel BP.

The first substrate 4 includes the first electrodes 10, one for each subpixel, arranged in an insular fashion. The first electrode 10 serves as one of the two electrodes of the light-emitting element. The first substrate 4 may include a subpixel circuit for each subpixel, so that the first electrodes 10 can be connected to the respective subpixel circuits on the first substrate 4 to be individually driven. The adjacent first electrodes 10 are separated by distance d1 in the present embodiment as shown in FIG. 2.

The first substrate 4 may include, for example, routing lines 4PL or external input terminals for connecting to the subpixel circuits to individually drive each first electrode 10. The first substrate 4 may include a routing line 4CL electrically connected to the second electrode 12. The first substrate 4 may further include a power supply 4P connected to the routing lines 4PL and the routing line 4CL.

The power supply 4P may apply voltage to each first electrode 10 via the associated one of the routing lines 4PL. The voltage applied to the first electrode 10 may be controlled through a switching element 4S that includes, for example, a thin film transistor between the first electrode 10 and the routing line 4PL. For instance, the first electrode 10 may include layers of metal materials. The first electrode 10 may serve as the anode of the light-emitting element. The power supply 4P may similarly apply voltage to the second electrode 12 via the routing line 4CL.

The first electrodes 10 may be separated from each other by an edge cover 16 in the present embodiment as shown in FIG. 2. The edge cover 16 may cover the edges of the first electrodes 10 and have an opening for each subpixel to expose parts of the top face of the first electrode 10. The edge cover 16 may be made of an organic material containing, for example, a photosensitive resin.

The second substrate 6 includes the second electrode 12 which is common to all the subpixels. The second electrode 12, paired up with the first electrode 10, serves as the other one of the two electrodes of the light-emitting element. The second substrate 6 and the second electrode 12 may be transparent in the present embodiment. For instance, the second electrode 12 may contain ITO (indium tin oxide). The second electrode 12 may serve as the cathode of the light-emitting element. The first electrodes 10 and the second electrode 12 are separated by a minimum distance d2 shown in FIG. 2 in the present embodiment.

The functional layer 14 includes a first charge transport layer 18, light-emitting layers 20, and a second charge transport layer 22 arranged in this order when viewed from the first electrodes 10. The functional layer 14, in the present embodiment, includes the first charge transport layer 18 and the second charge transport layer 22 as functional layers that are common to all the subpixels and includes the light-emitting layers 20 as functional layers that are separately provided for each subpixel.

The first charge transport layer 18 transports electric charge from the first electrodes 10 to the light-emitting layers 20. The first charge transport layer 18 may have a layered structure. For instance, when the first electrode 10 serves as the anode, the first charge transport layer 18 may include a stack of a hole injection layer, a hole transport layer, and an electron blocking layer arranged in this order when viewed from the first electrodes 10. The first charge transport layer 18 may contain a publicly known, charge transport material.

The second charge transport layer 22 transports electric charge from the second electrode 12 to the light-emitting layers 20. The second charge transport layer 22 may have a layered structure similarly to the first charge transport layer 18. For instance, when the second electrode 12 serves as the cathode, the second charge transport layer 22 may include a stack of an electron injection layer, an electron transport layer, and a hole blocking layer arranged in this order when viewed from the second electrode 12.

The second charge transport layer 22 is a nanoparticle layer containing a stack of nanoparticles as a charge transport material in the present embodiment. The nanoparticles in the second charge transport layer 22 may contain a metal element such as Zn, Mg, In, Cd, Pb, Ga, Al, Mo, or Ni. The second charge transport layer 22 may contain nanoparticles of an oxide of any of these metal elements as a charge transport material.

In the display device 2, the electric charge from the first electrodes 10 and the electric charge from the second electrode 12 recombine in a light-emitting material in the light-emitting layers 20, so that the light-emitting layers 20 emit light. The light-emitting layers 20 may contain, as a light-emitting material, an organic light-emitting material containing, for example, fluorescent material or phosphor or an inorganic light-emitting material containing, for example, quantum dots.

Each light-emitting layer 20 includes a first light-emitting layer 20R that gives off red light in the red subpixel RP, a second light-emitting layer 20G that gives off green light in the green subpixel GP, and a third light-emitting layer 20B that gives off blue light in the blue subpixel GP. In other words, in the display device 2, the red subpixel RP includes formed therein the red light-emitting element RE including the first light-emitting layer 20R, the green subpixel GP includes formed therein the green light-emitting element GE including the second light-emitting layer 20G, and the blue subpixel BP includes formed therein the blue light-emitting element BE including the third light-emitting layer 20B. The light-emitting layer 20 in each subpixel of the display device 2 is formed as a subpixel-specific layer that is isolated from the light-emitting layers 20 in the adjacent subpixels.

The present embodiment further includes a sealing member 24 interposed between the first substrate 4 and the second substrate 6. The sealing member 24 includes an adhesive resin 26 and conductive particles 28. The adhesive resin 26 adheres to both the top face of the first substrate 4 and the bottom face of the second substrate 6, thereby sealing the light-emitting elements in the display device 2. Particularly, the adhesive resin 26 overlaps a part of the second electrode 12 and adheres to the second electrode 12. The conductive particles 28 may be in contact with both the second electrode 12 and the routing line 4CL on the first substrate 4 to establish electrical conducts via which the first substrate 4 can apply voltage to the second electrode 12. Referring to FIG. 1, the sealing member 24 may be provided along the periphery of the display device 2 so that the sealing member 24 is shaped like a frame when viewed from above.

The display device 2 includes cavities 30 between the first substrate 4 and the second substrate 6 in the present embodiment as shown in FIG. 2. Particularly, there is provided a cavity 30 between every pair of adjacent light-emitting layers 20 in the display device 2. The display device 2 may further include cavities 30 between the sealing member 24 and those light-emitting layers 20 that are adjacent to the sealing member 24.

Figure 3:
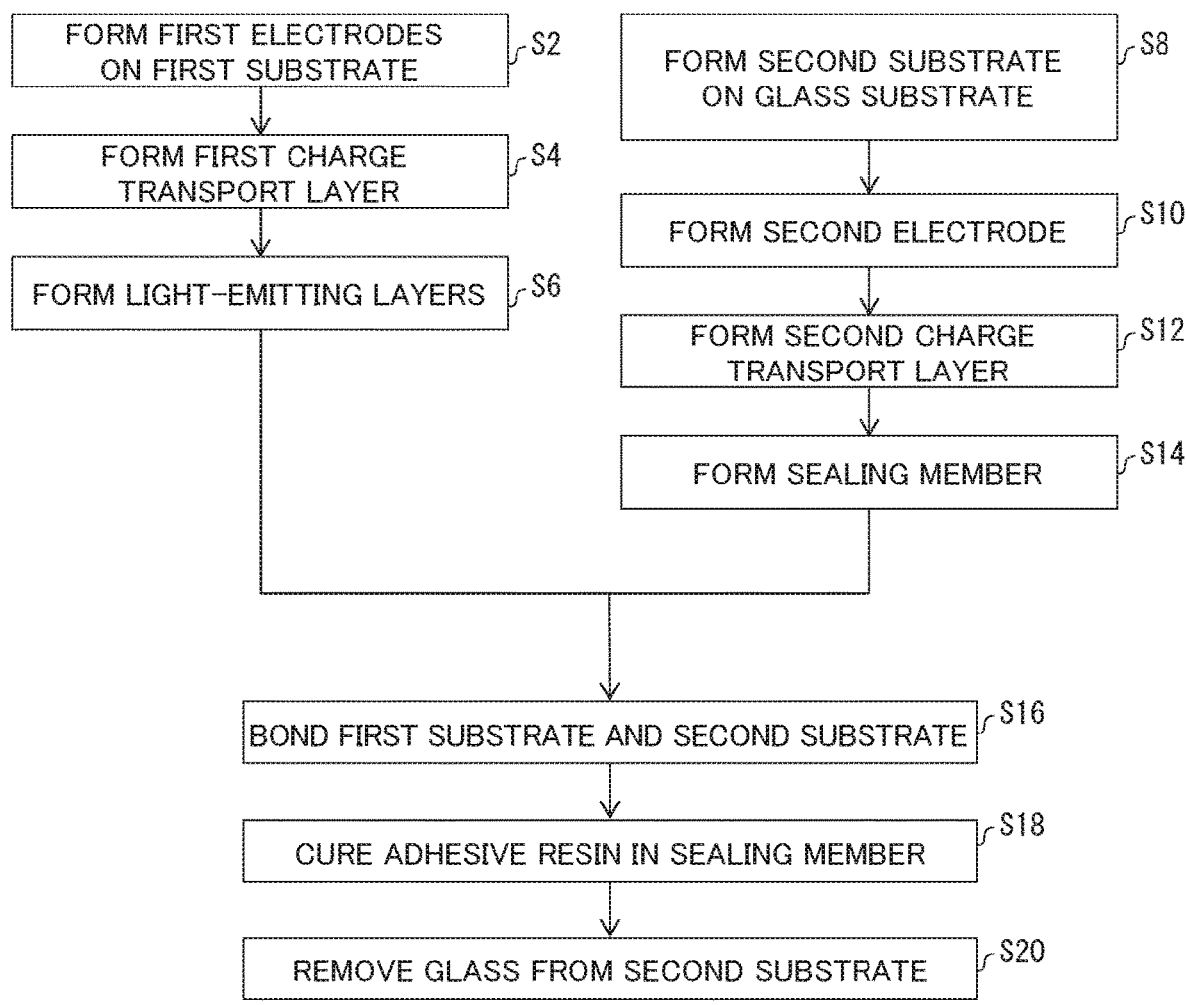
FIG. 3 is a flow chart representing a method of manufacturing a display device in accordance with Embodiment 1.
Figure 4:
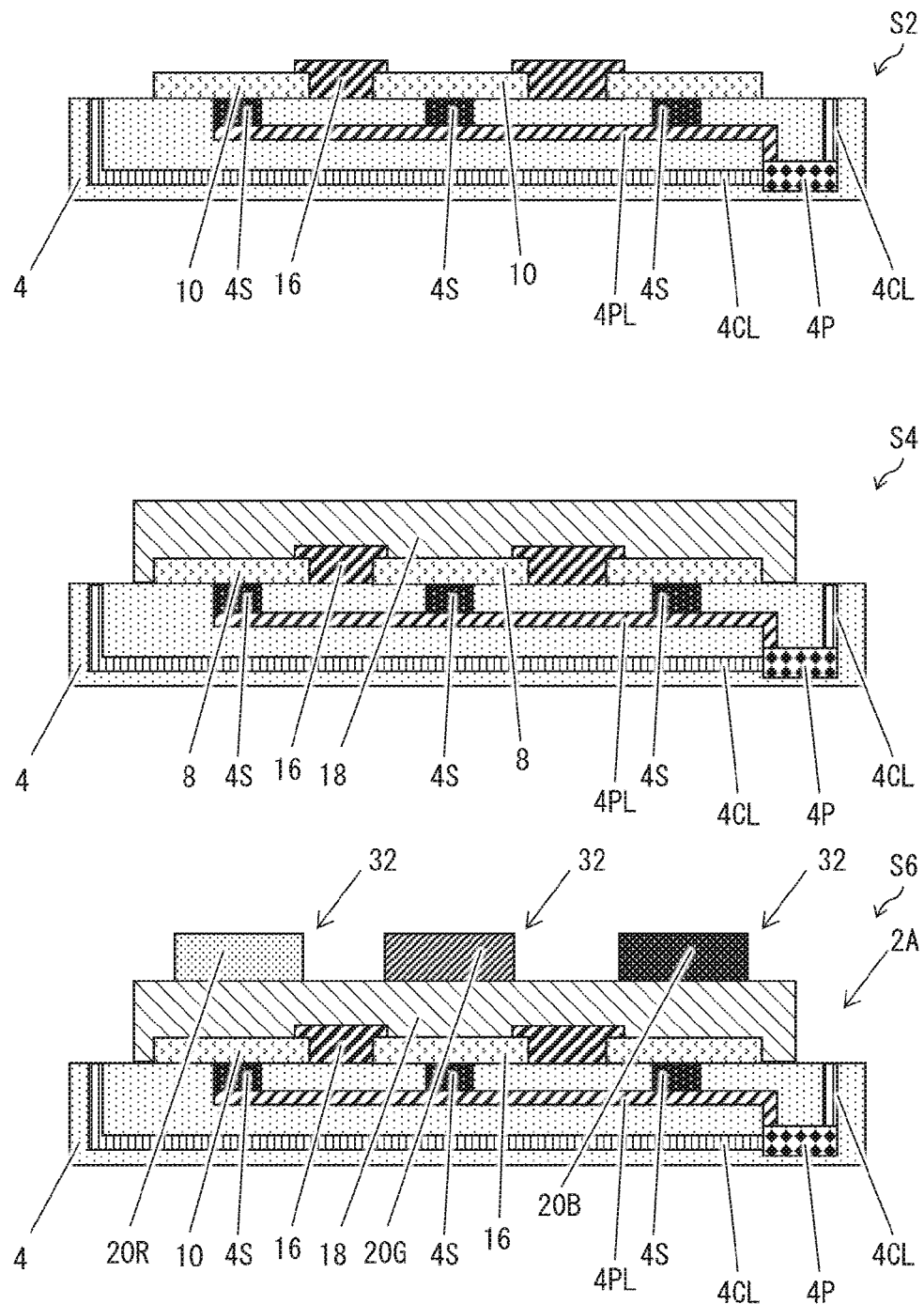
FIG. 4 is a set of step-specific cross-sectional views illustrating a method of preparing a first stack body in accordance with Embodiment 1.
Figure 5:
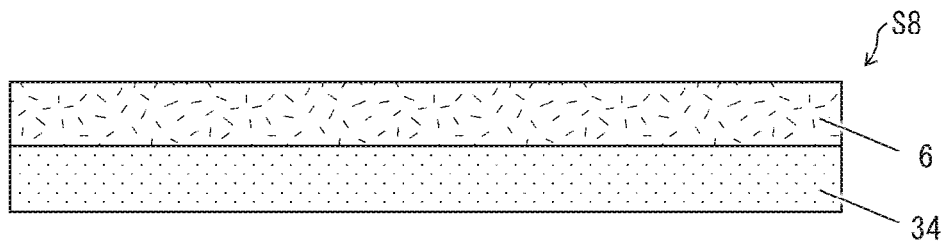
FIG. 5 is a set of step-specific cross-sectional views illustrating a method of preparing a second stack body in accordance with Embodiment 1.
Figure 5:
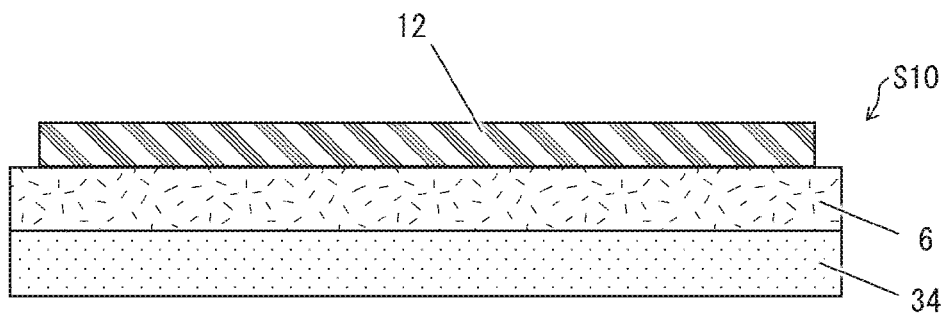
Figure 5:
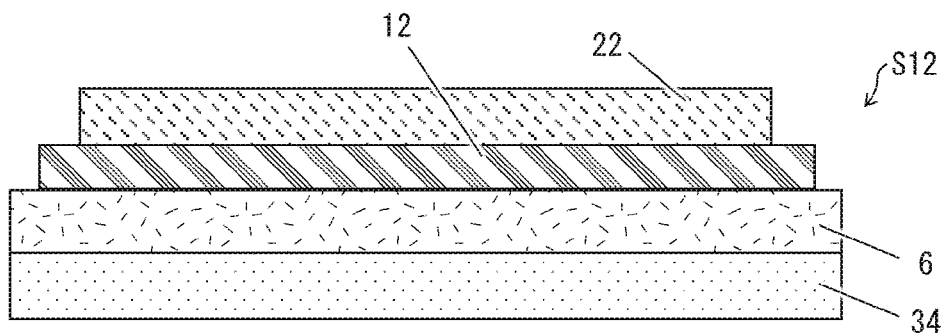
Figure 5:
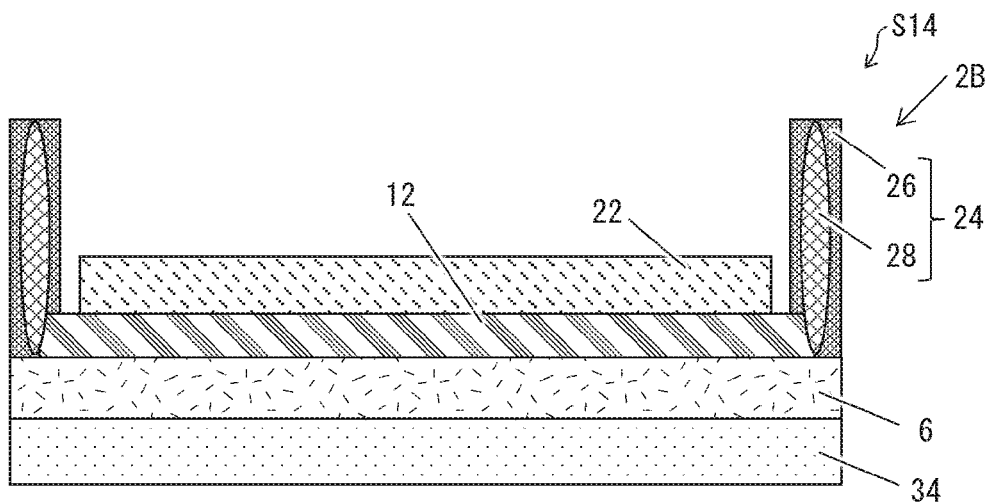
Figure 6:
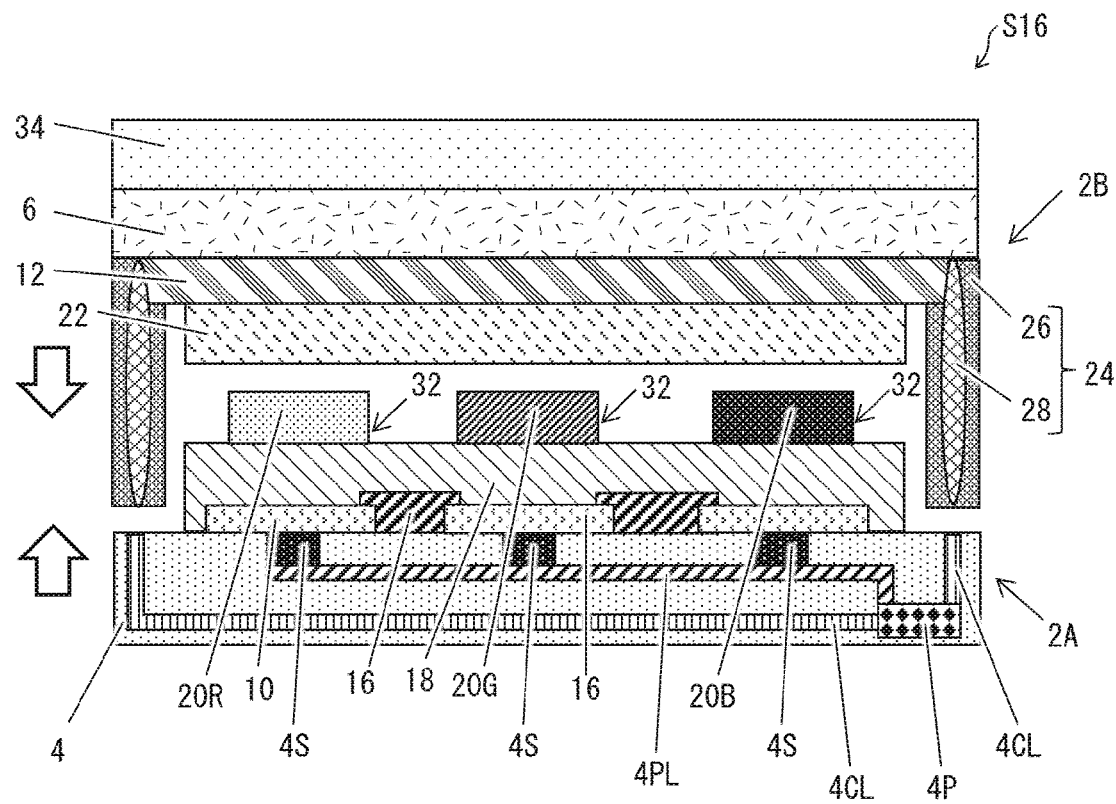
FIG. 6 is a set of step-specific cross-sectional views illustrating a bonding step in accordance with Embodiment 1.
Figure 6:
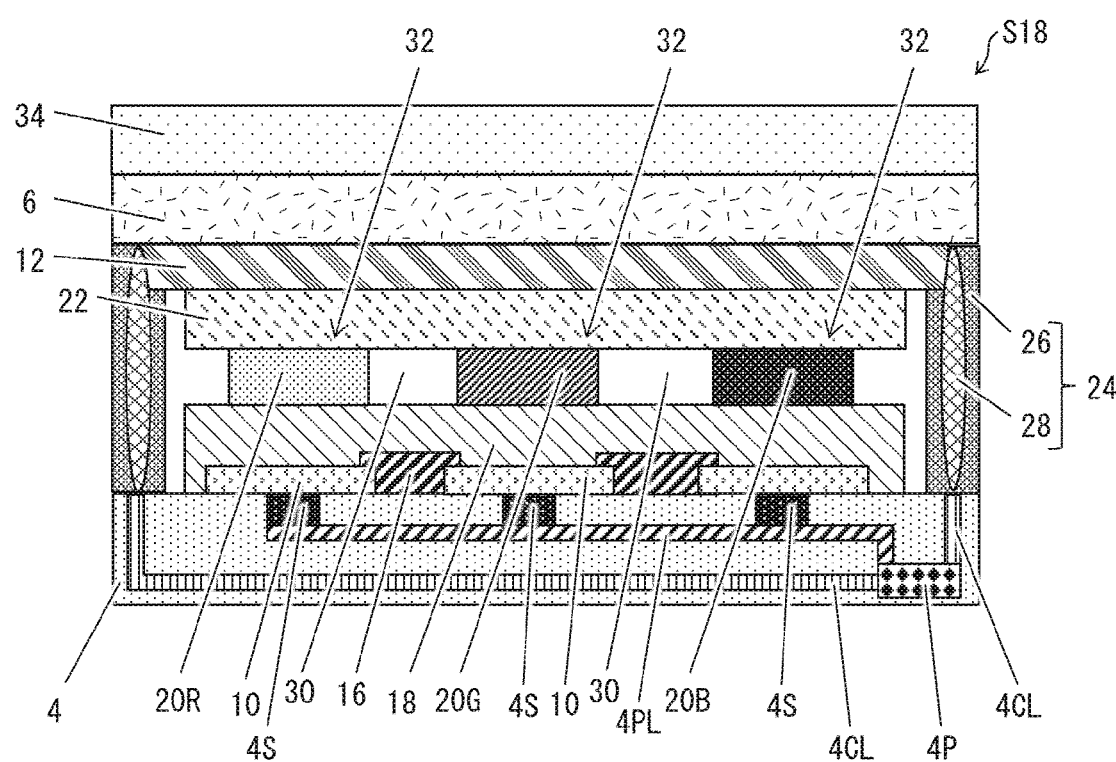

A detailed description is now given of a method of manufacturing the display device 2 in accordance with the present embodiment with reference to FIGS. 3 to 6. FIG. 3 is a flow chart representing a method of manufacturing the display device 2 in accordance with the present embodiment. FIGS. 4 to 6 are step-specific cross-sectional views of the display device 2 for the steps shown in FIG. 3. The step-specific cross-sectional views in the present specification, including those in FIGS. 4 to 6, show the same cross-section as the cross-sectional view in FIG. 2.

Firstly in the method of manufacturing the display device 2 in accordance with the present embodiment, the first electrodes 10 and the edge cover 16 are formed on the first substrate 4 as shown in FIG. 4 to prepare the first substrate 4 including the first electrodes 10 thereon (step S2). Step S2 is a first substrate preparation step. In step S2, the first electrodes 10 may be formed by, for example, a publicly known, electrode forming technique of forming a film by sputtering and patterning the resultant film by etching. The edge cover 16 may be formed by, for example, photolithography. As an alternative example, the routing lines 4PL, the routing line 4CL, the power supply 4P, and the switching elements 4S may be formed on the first substrate 4 by a publicly known, technique in step S2.

Next, the first charge transport layer 18 is formed on the first substrate 4 as shown in FIG. 4 (step S4). The first charge transport layer 18 may be formed by a publicly known, charge transport layer forming technique such as vapor deposition or coating in step S4.

Next, the light-emitting layers 20 are formed (step S6). In the present embodiment, since the light-emitting layers 20 are subpixel-specific layers, step S6 of the present embodiment is a subpixel-specific layer forming step. The light-emitting layers 20 may be formed by repeatedly performing a publicly known, forming technique for the light-emitting layers 20 in accordance with the number of types of the light-emitting layers 20.

If the light-emitting layers 20 contain, for example, an organic light-emitting material as a light-emitting material, the light-emitting layers 20 may be formed by vapor deposition using a metal mask in step S6, in which case the individual light-emitting layers 20 may be separately formed by changing the vapor deposition sources and the metal mask patterns every time.

Meanwhile, if the light-emitting layers 20 contain, for example, quantum dots as a light-emitting material, the light-emitting layers 20 may be formed by applying a photosensitive material containing dispersed quantum dots and patterning the photosensitive material by photolithography in step S6, in which case different types of light-emitting layers 20 may be separately formed by repeating the application and patterning of the photosensitive material.

The light-emitting layers 20 may be formed by another technique such as lift-off, electrodeposition, nanoimprinting, or printing in step S6.

These steps prepare a first stack body 2A shown in FIG. 4 including the first substrate 4 and a stack of layers on the first substrate 4. The disposition of the light-emitting layers 20 on the first substrate 4 enables forming lumps 32 in locations that overlap the first electrodes 10 on the first substrate 4.

Apart from steps S2 to S6, the second substrate 6 is formed on a glass substrate 34 as shown in FIG. 5 in the method of manufacturing the display device 2 in accordance with the present embodiment (step S8). The glass substrate 34 may be a publicly known, rigid and transparent substrate. The second substrate 6 may be adhered to the glass substrate 34 via, for example, an adhesive layer. Alternatively, the second substrate 6 may be formed by applying a polyimide film on the glass substrate 34 in the present embodiment.

Next, the second substrate 6 including the second electrode 12 is prepared by forming the second electrode 12 on the second substrate 6 as shown in FIG. 5 (step S10). Step S10 is a second substrate preparation step. In step S10, the second electrode 12 may be formed by, for example, a publicly known, electrode forming technique such as sputtering, similarly to the first electrodes 10.

Next, the second charge transport layer 22 is formed on the second electrode 12 as shown in FIG. 5 (step S12). In the present embodiment, since the second charge transport layer 22 is a nanoparticle layer, step S12 of the present embodiment is a nanoparticle layer forming step. In step S12, the second charge transport layer 22 may be formed by applying a colloidal solution of dispersed nanoparticles on the second electrode 12, for example, using a coater or by inkjet printing or screen printing.

Next, the sealing member 24 is formed on the second substrate 6 as shown in FIG. 5 (step S14). In step S14, the adhesive resin 26 containing the conductive particles 28 may be formed by applying to the periphery of the second electrode 12. The additional disposition of the adhesive resin 26 containing the conductive particles 28 in locations that overlap the second electrode 12 in step S14 establishes electrical conduction between the second electrode 12 and the conductive particles 28.

These steps prepare a second stack body 2B shown in FIG. 5 including the second substrate 6 and a stack of layers on the second substrate 6. In other words, the second charge transport layer 22, which is a nanoparticle layer, is formed on the topmost face of the second stack body 2B as shown in FIG. 5.

After both steps S6 and S14 are completed, the first stack body 2A and the second stack body 2B are bonded together in such a manner that the first electrodes 10 and the second electrode 12 face each other as shown in FIG. 6 (step S16). Step S16 is a bonding step.

Next, the first substrate 4 and the second substrate 6 are fixed by curing the adhesive resin 26 in the sealing member 24 as shown in FIG. 6 (step S18).

In step S16, the sealing member 24 in the second stack body 2B is adhered to the first substrate 4 in the first stack body 2A as shown in FIG. 6. Step S18 thus forms bonding between the first substrate 4 in the first stack body 2A and the second substrate 6 in the second stack body 2B as shown in FIG. 6.

A single display device 2 is formed between the first substrate 4 and the second substrate 6 in the present embodiment. Alternatively, a plurality of display devices 2 may be simultaneously formed.

The bonding between the first substrate 4 and the second substrate 6 forms contacts between the first substrate 4 and the second substrate 6 via those parts of the second charge transport layer 22 in locations that overlap the lumps 32 in step S18 as shown in FIG. 6. In other words, the first substrate 4 and the second substrate 6 are bonded together via the second charge transport layer 22, which is a nanoparticle layer, in step S16. In other words, the second charge transport layer 22, which is a nanoparticle layer, is in contact with both the first substrate 4 and the second substrate 6 in locations that overlap the lumps 32.

As described above, the first substrate 4 and the second substrate 6 are bonded together via only the sealing member 24 and the lumps 32 in step S16. Step S16 hence forms the cavities 30, each between a different pair of adjacent light-emitting layers 20, between the first substrate 4 and the second substrate 6.

Figure 7:
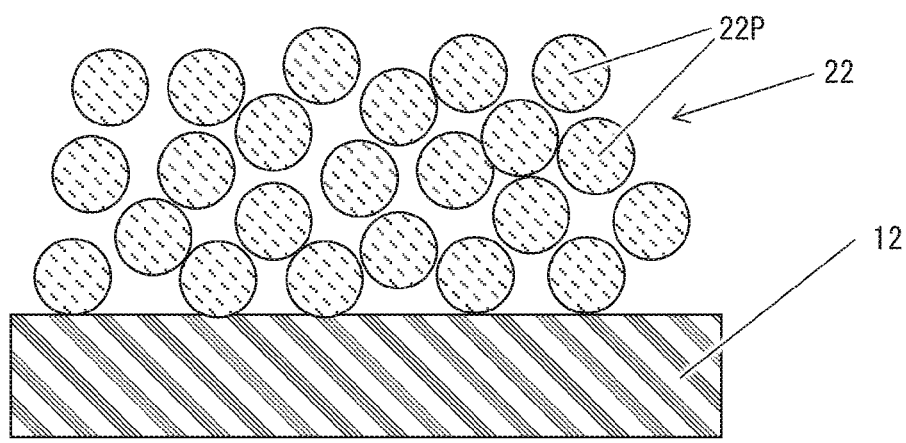
FIG. 7 is a schematic view of nanoparticles before bonding in the bonding step in accordance with Embodiment 1.
Figure 8:
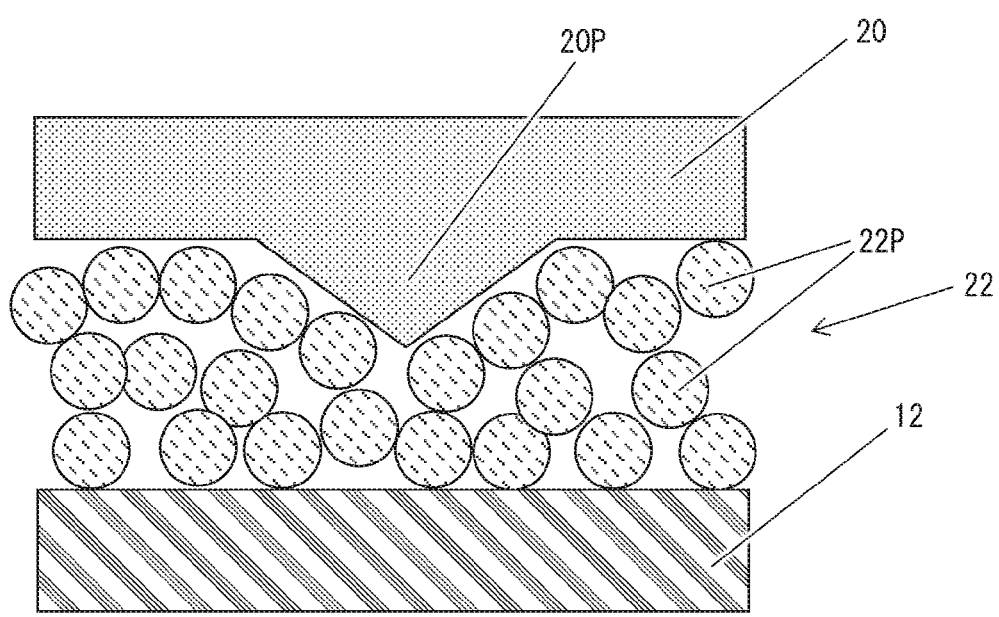
FIG. 8 is a schematic view of the nanoparticles after the bonding in the bonding step in accordance with Embodiment 1.

Referring to FIGS. 7 and 8, a detailed description is now given of the condition of the nanoparticles in the second charge transport layer 22 in the bonding step for the first electrodes 10 and the second electrode 12. FIG. 7 is an enlarged cross-sectional view of the second charge transport layer 22 on the second electrode 12 before the first electrodes 10 and the second electrode 12 are bonded together. FIG. 8 is an enlarged cross-sectional view of the second charge transport layer 22 on the second electrode 12 after the first electrodes 10 and the second electrode 12 are bonded together.

The second charge transport layer 22, for example, includes a stack of nanoparticles 22P as shown in FIG. 7. A solution containing the nanoparticles 22P is simply applied onto the second electrode 12 in an application step for the second charge transport layer 22. The nanoparticles 22P may be therefore not tightly stacked immediately before the bonding step, potentially leaving voids in the second charge transport layer 22.

In the bonding step, as shown in FIG. 8, the light-emitting layer 20 moves into contact with the nanoparticles 22P, thereby crushing the voids. This mechanism repositions the nanoparticles 22P in the second charge transport layer 22. Especially, if the light-emitting layer 20 has a protruding shape, like a protrusion 20P shown in FIG. 8, on the surface thereof that comes into contact with the second charge transport layer 22, the nanoparticles 22P in the second charge transport layer 22 are repositioned along the protruding shape.

Since the second charge transport layer 22 is a nanoparticle layer, the nanoparticles 22P flow and reposition themselves in the second charge transport layer 22 due to the contact of the light-emitting layer 20 with the second charge transport layer 22. This mechanism reduces the damage to the light-emitting layer 20 and the second charge transport layer 22 caused by the contact of these two layers in comparison with when the second charge transport layer 22 is a rigid layer with zero fluidity. The repositioning of the nanoparticles 22P more tightly adheres the light-emitting layers 20 and the second charge transport layer 22 together in the bonding step, enabling reliable injection of electric charge from the second charge transport layer 22 to the light-emitting layers 20.

This repositioning of the nanoparticles 22P crushes voids between the nanoparticles 22P, which increases the density of the nanoparticles 22P. Therefore, the nanoparticles 22P have a higher average density in those locations where the second charge transport layer 22 overlaps the light-emitting layers 20, that is, where the second charge transport layer 22 overlaps the lumps 32, than in those locations where the second charge transport layer 22 overlaps gaps separating adjacent subpixel-specific layers. The repositioning of the nanoparticles 22P in the bonding step occurs when the nanoparticle layer containing the nanoparticles 22P is provided on the topmost face of either of the stack bodies (the most remote part from the substrate).

Lastly, the glass substrate 34 is removed from the second substrate 6 (step S20), which completes the manufacture of the display device 2 shown in FIGS. 1 and 2.

The glass substrate 34 may be removed from the second substrate 6 by laser lift-off. Laser lift-off may be carried out by projecting a laser beam onto the adhesive layer interfacing between the second substrate 6 and the glass substrate 34 through the glass substrate 34, thus reducing the adherence of the glass substrate 34 to the second substrate 6, and detaching the glass substrate 34 from the second substrate 6.

The display device 2 is manufactured in the present embodiment by bonding the first substrate 4 including the first electrodes 10 and the second substrate 6 including the second electrode 12 via the light-emitting layers 20, which are subpixel-specific layers, and the second charge transport layer 22, which is a nanoparticle layer. This method reduces the damage to the functional layer 14 caused by sputtering in forming the second electrode 12 following the formation of the functional layer 14 in comparison with a method where layers are formed one by one on the first substrate 4 starting with the first electrodes 10 and finishing with the second electrode 12. The present embodiment hence improves yield in the manufacture of the display device 2.

The display device 2 includes the cavities 30 between the light-emitting layers 20, which lowers the risk of short-circuiting between the light-emitting layers 20. Additionally, the lumps 32 are provided respectively on those parts of the first stack body 2A including the first substrate 4 that overlap the light-emitting layers 20 in the present embodiment. This particular structure facilitates the formation of the cavities 30 between the light-emitting layers 20 when the light-emitting layers 20 come into contact with the second charge transport layer 22 in the bonding step.

Distance d2 is preferably shorter than distance d1 in the present embodiment. This particular structure further facilitates the formation of the cavities 30 and further lowering the risk of short-circuiting between the subpixels.

The second charge transport layer 22 is a nanoparticle layer provided commonly to the subpixels in the present embodiment. This particular structure does not cause damage to the light-emitting layers 20, which are subpixel-specific layers, even when high-temperature baking or sputtering is needed in a nanoparticle layer forming step. The structure also does not require individual patterning of the second charge transport layer 22, thereby simplifying the formation of the second charge transport layer 22.

The second charge transport layer 22 is provided on the second substrate 6 in the present embodiment. This structure can prevent damage to the light-emitting layers 20 in the step of forming the second charge transport layer 22 in comparison with when the second charge transport layer 22 is individually provided further on the light-emitting layers 20. The structure also does not require the individual formation of the second charge transport layer 22 in the formation of the second charge transport layer 22. The step of forming the second charge transport layer 22 in accordance with the present embodiment can hence reduce the overall takt time in the manufacture of the display device in comparison with when the second charge transport layer 22 is individually provided further on the light-emitting layers 20.

The electrical conduction between the circuitry on the first substrate 4 and the second electrode 12 is provided in the present embodiment via the conductive particles 28 in the sealing member 24. This structure lowers the need to separately provide contact holes, for example, in the functional layer 14 so that the first substrate 4 can apply voltage to the second electrode 12, which in turn leads to simplification of the manufacture of the display device 2.

Variation Example 1

The display device 2 in accordance with the present variation example may have the same structure as the display device 2 in accordance with the preceding embodiment, except for the material for the light-emitting layers 20. In the present variation example, the light-emitting layers 20 are nanoparticle layers containing quantum dots, that is, semiconductor nanoparticles, as a light-emitting material. The light-emitting layers 20 therefore double as subpixel-specific layers and nanoparticle layers in the present variation example.

The second charge transport layer 22 may be a nanoparticle layer in the present variation example as in the preceding embodiment. Alternatively, the second charge transport layer 22 may contain a publicly known, charge transport material in the present variation example.

The display device 2 in accordance with the present variation example can be manufactured by the same techniques as the display device 2 in accordance with the preceding embodiment. The present variation example hence advantageously improves yield in the manufacture of the display device 2 similarly to the preceding embodiment.

Since there is provided an individual nanoparticle layer for each subpixel in the present variation example, the first substrate 4 and the second substrate 6 are more reliably bonded even when the light-emitting layers 20, which are subpixel-specific layers, have a structure that is difficult to deform. In addition, since the light-emitting layers 20 double as subpixel-specific layers and nanoparticle layers in the present variation example, the second charge transport layer 22 does not need to be a nanoparticle layer. This can increase design freedom for the second charge transport layer 22, hence freedom in forming the second charge transport layer 22.

Figure 9:
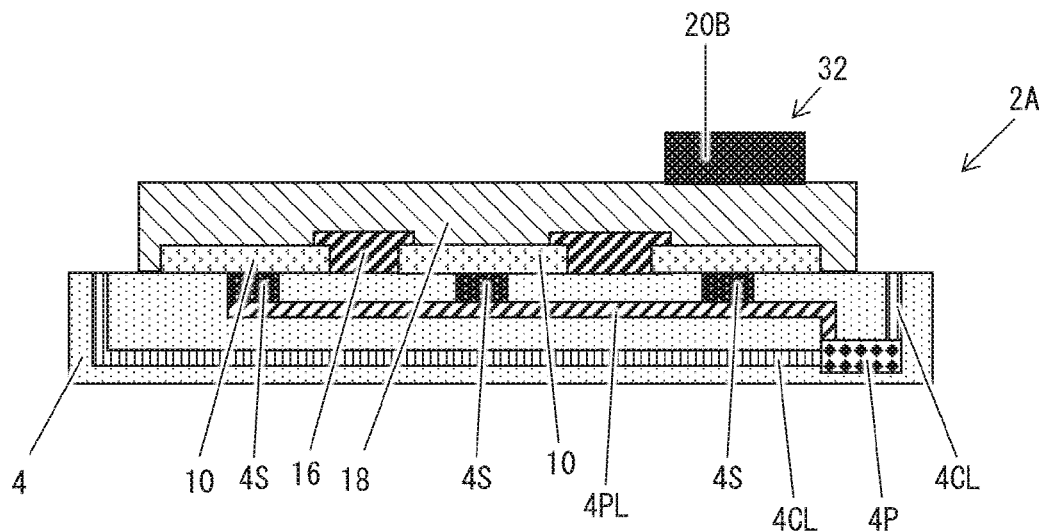
FIG. 9 is a set of schematic cross-sectional views of a first stack body and a second stack body in accordance with Variation Example 1.
Figure 9:
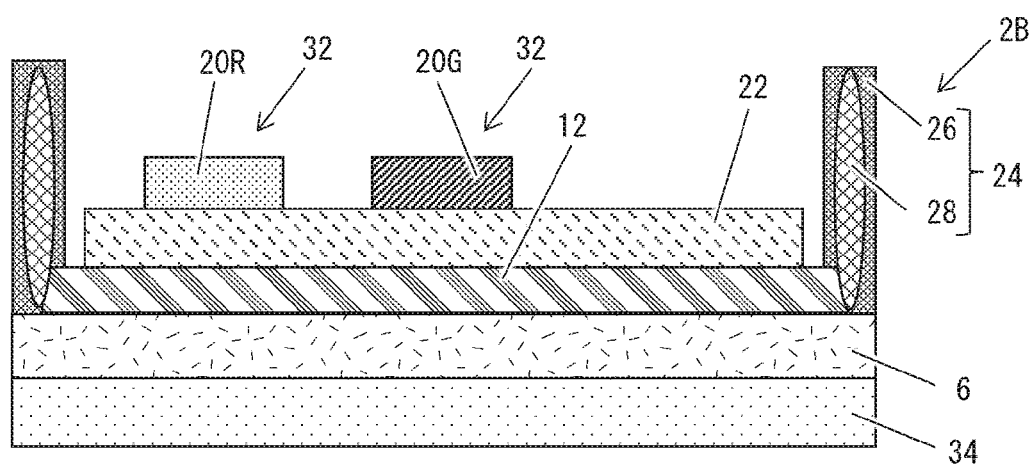

The first stack body 2A and the second stack body 2B may be modified in structure in the present variation example over the preceding embodiment. FIG. 9 is a set of schematic cross-sectional views of exemplary structures of the first stack body 2A and the second stack body 2B in accordance with the present variation example.

Of the light-emitting layers 20, the third light-emitting layers 20B may only be provided on the first stack body 2A in accordance with the present variation example as shown in FIG. 9. When the first stack body 2A has the structure shown in FIG. 9, the first light-emitting layers 20R and the second light-emitting layers 20G, of the light-emitting layers 20, are provided on the second stack body 2B as shown in FIG. 9. The second stack body 2B therefore includes lumps 32 formed thereon.

In the present variation example, only some of the light-emitting layers 20, which are subpixel-specific layers, may be provided on the first substrate 4 whilst the rest of the light-emitting layers 20 may be provided on the second substrate 6, as shown in FIG. 9. This particular structure can reduce the damage to the earlier formed subpixel-specific layers caused in forming the later formed subpixel-specific layers in the present variation example.

Figure 10:
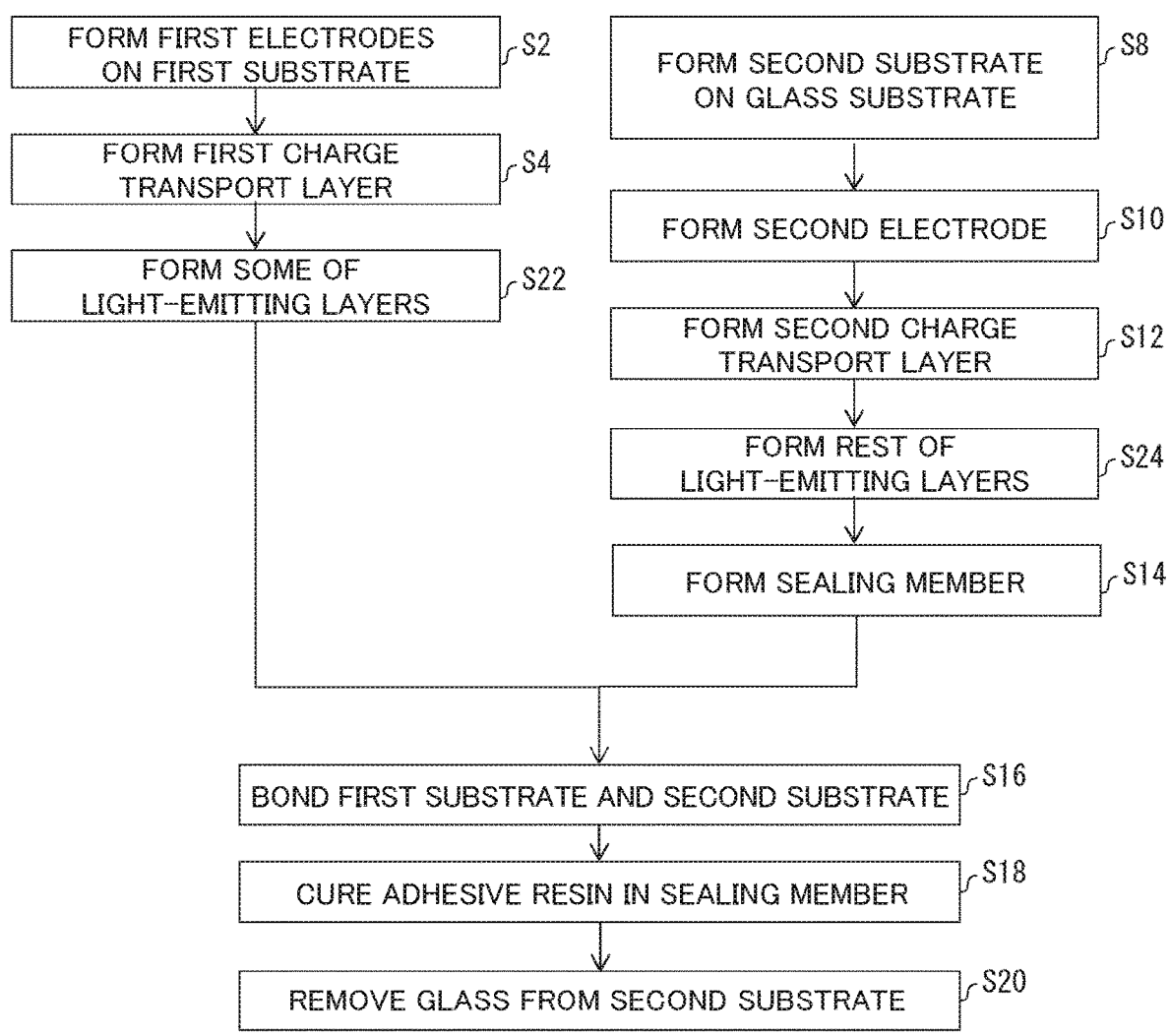
FIG. 10 is a flow chart representing a method of manufacturing a display device in accordance with Variation Example 1.

The display device 2 in accordance with the present variation example is manufactured by following the steps shown in the flow chart in FIG. 10. Firstly, steps S2 and S4 described above are performed in this order. Next, of the light-emitting layers 20, only the third light-emitting layers 20B are formed on the first charge transport layer 18 (step S22). Step S22 may be performed by the same technique as step S6 described above. These steps prepare the first stack body 2A shown in FIG. 9.

Next, steps S8, S10, and S12 described above are performed in this order. Next, the rest of the light-emitting layers 20 that was not formed in step S22 (namely, the first light-emitting layers 20R and the second light-emitting layers 20G) is formed on the second charge transport layer 22 (step S24). Step S24 may be performed by the same technique as step S6 described above. These steps prepare the second stack body 2B shown in FIG. 9.

Lastly, steps S16, S18, and S20 described above are performed in this order to bond the first stack body 2A and the second stack body 2B together, which completes the manufacture of the display device 2 shown in, for example, FIGS. 1 and 2. In other words, the first stack body 2A and the second stack body 2B in accordance with the present variation example can be bonded by the same techniques as the techniques used in manufacturing the display device 2 in accordance with the preceding embodiment.

The first stack body 2A and the second stack body 2B are stacked and bonded in step S16 such that the third light-emitting layers 20B on the first stack body 2A do not overlap the first light-emitting layers 20R and the second light-emitting layers 20G on the second stack body 2B.

The first light-emitting layers 20R, the second light-emitting layers 20G, and the third light-emitting layers 20B double as subpixel-specific layers and nanoparticle layers in the present variation example. Steps S22 and S24 are therefore a nanoparticle layer forming step as well as a subpixel-specific layer forming step in the present variation example. The subpixel-specific layer forming step and the nanoparticle layer forming step may be performed as a single step as demonstrated in the present variation example.

Variation Example 2

Figure 11:
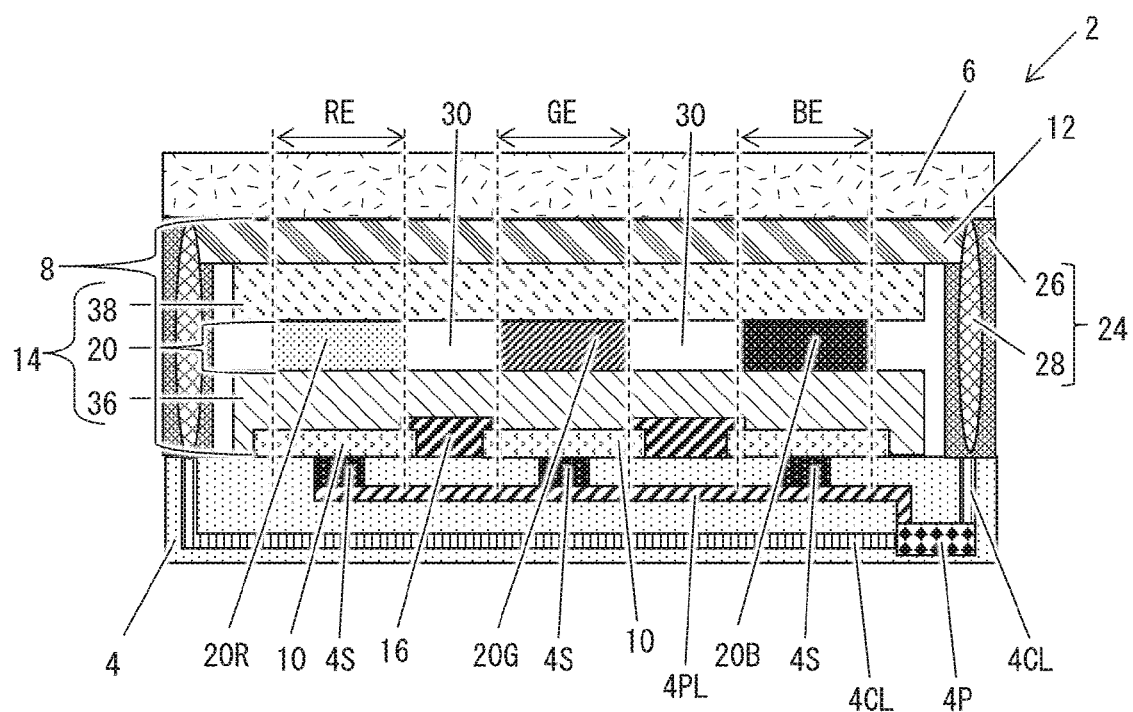
FIG. 11 is a schematic cross-sectional view of a display device in accordance with Variation Example 2.

FIG. 11 is a cross-sectional view of the display device 2 in accordance with the present variation example. The display device 2 in accordance with the present variation example may have the same structure as the display device 2 in accordance with the preceding embodiment, except that the former includes a first charge transport layer 36 in place of the first charge transport layer 18 and a second charge transport layer 38 in place of the second charge transport layer 22.

The display device 2 includes the first charge transport layer 36 as a nanoparticle layer in the present variation example. The first charge transport layer 36 includes a stack of nanoparticles as a charge transport material. The nanoparticles in the first charge transport layer 36 may contain a metal element such as Zn, Mg, In, Cd, Pb, Ga, Al, Mo, or Ni. The first charge transport layer 36 may contain nanoparticles of an oxide of any of these metal elements as a charge transport material. The second charge transport layer 38 may contain a publicly known, material as a charge transport material in the present variation example.

Figure 12:
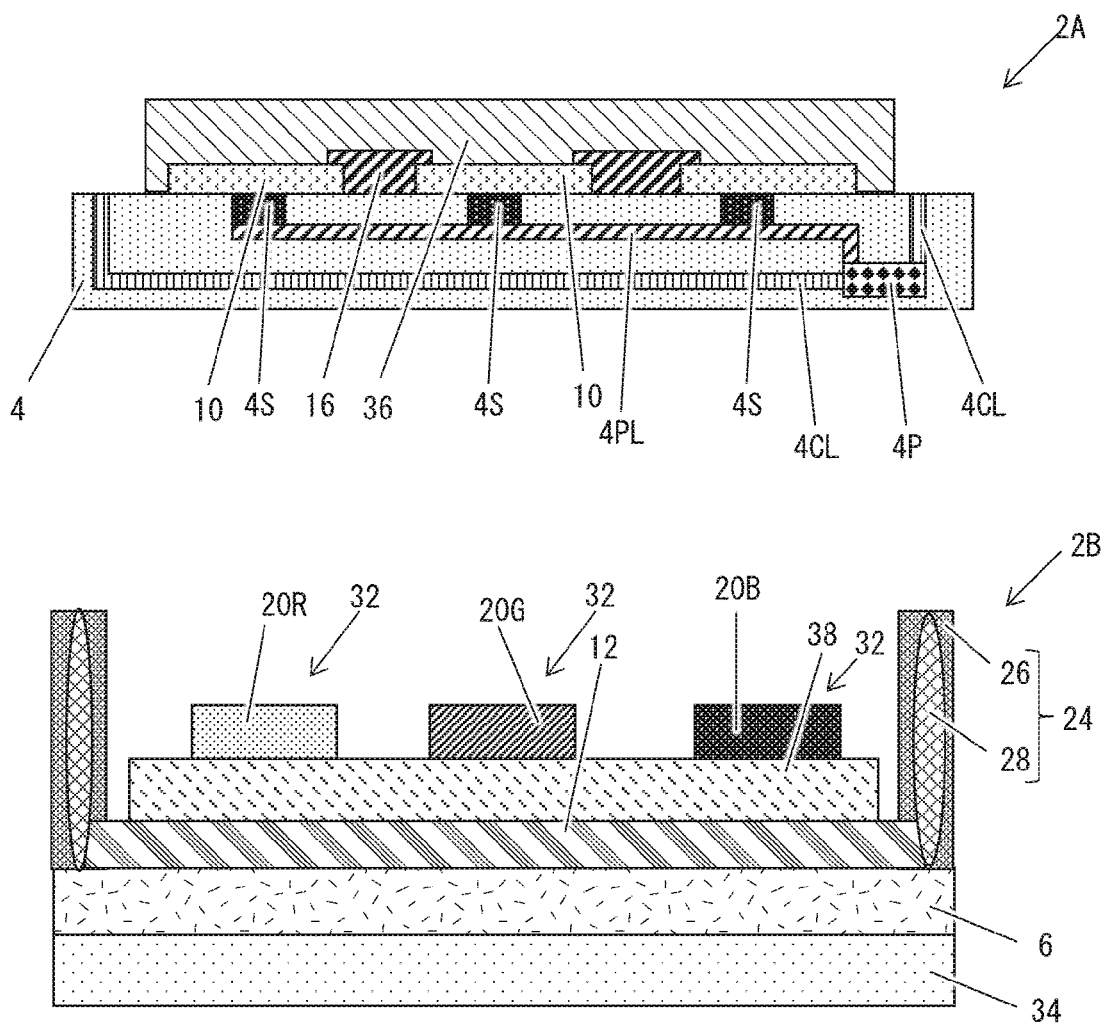
FIG. 12 is a set of schematic cross-sectional views of a first stack body and a second stack body in accordance with Variation Example 2.

FIG. 12 is a set of schematic cross-sectional views of exemplary structures of the first stack body 2A and the second stack body 2B in accordance with the present variation example. The first stack body 2A in accordance with the present variation example differs from the first stack body 2A shown in FIG. 4 in that the former includes the first charge transport layer 36 in place of the first charge transport layer 18 and includes no light-emitting layers 20, as shown in FIG. 12. The second stack body 2B in accordance with the present variation example differs from the second stack body 2B shown in FIG. 5 in that the former includes the second charge transport layer 38 in place of the second charge transport layer 22 and includes light-emitting layers 20, as shown in FIG. 12.

Figure 13:
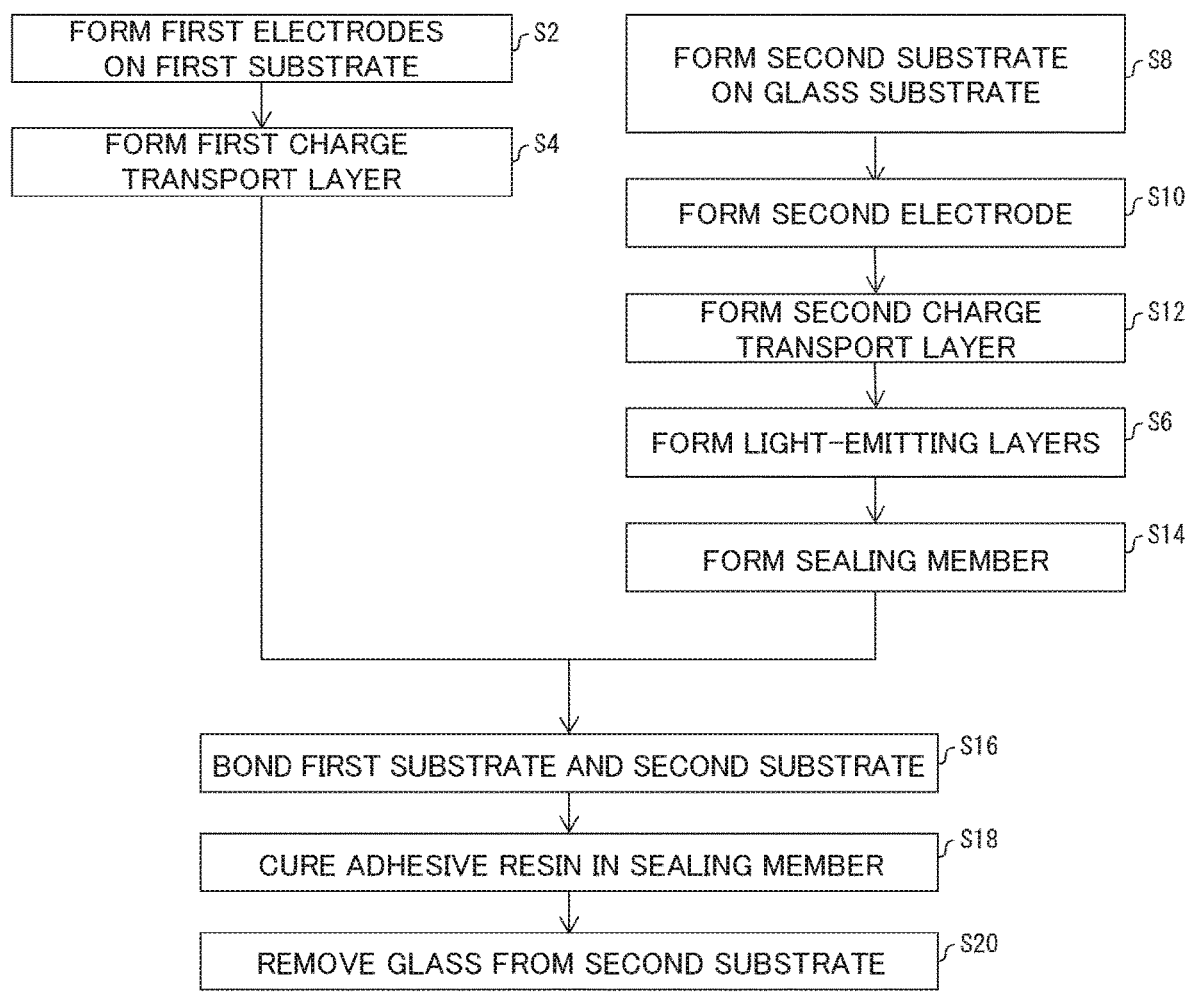
FIG. 13 is a flow chart representing a method of manufacturing the display device in accordance with Variation Example 2.

The display device 2 in accordance with the present variation example is manufactured by following the steps shown in the flow chart in FIG. 13. Firstly, steps S2 and S4 described above are performed in this order to prepare the first stack body 2A shown in FIG. 12. The first charge transport layer 36 is a nanoparticle layer in the present variation example. Step S4, in which the first charge transport layer 36 is formed, is therefore a nanoparticle layer forming step in the present variation example. In step S4, the first charge transport layer 36 may be formed by applying a colloidal solution of dispersed nanoparticles on the first electrodes 10, for example, using a coater or by inkjet printing or screen printing.

Next, steps S8, S10, S12, S6, and S14 described above are performed in this order to prepare the second stack body 2B shown in FIG. 12. In other words, a second charge transport layer forming step is followed by a light-emitting layer forming step in the present variation example. The light-emitting layers 20 are subpixel-specific layers in the present variation example. Step S6, in which the light-emitting layers 20 are formed, is therefore a subpixel-specific layer forming step in the present variation example. The second charge transport layer 38 may be formed by a publicly known, charge transport layer forming technique such as vapor deposition or coating in step S12.

Lastly, steps S16, S18, and S20 described above are performed in this order to bond the first stack body 2A and the second stack body 2B together, which completes the manufacture of the display device 2 shown in, for example, FIG. 11.

The first substrate 4 and the second substrate 6 may be bonded by the same techniques as the techniques used in the above-described bonding step even when the first stack body 2A and the second stack body 2B have the structures shown in FIG. 12. The present variation example hence advantageously improves yield in the manufacture of the display device 2 similarly to the preceding embodiment.

Embodiment 2

Figure 14:
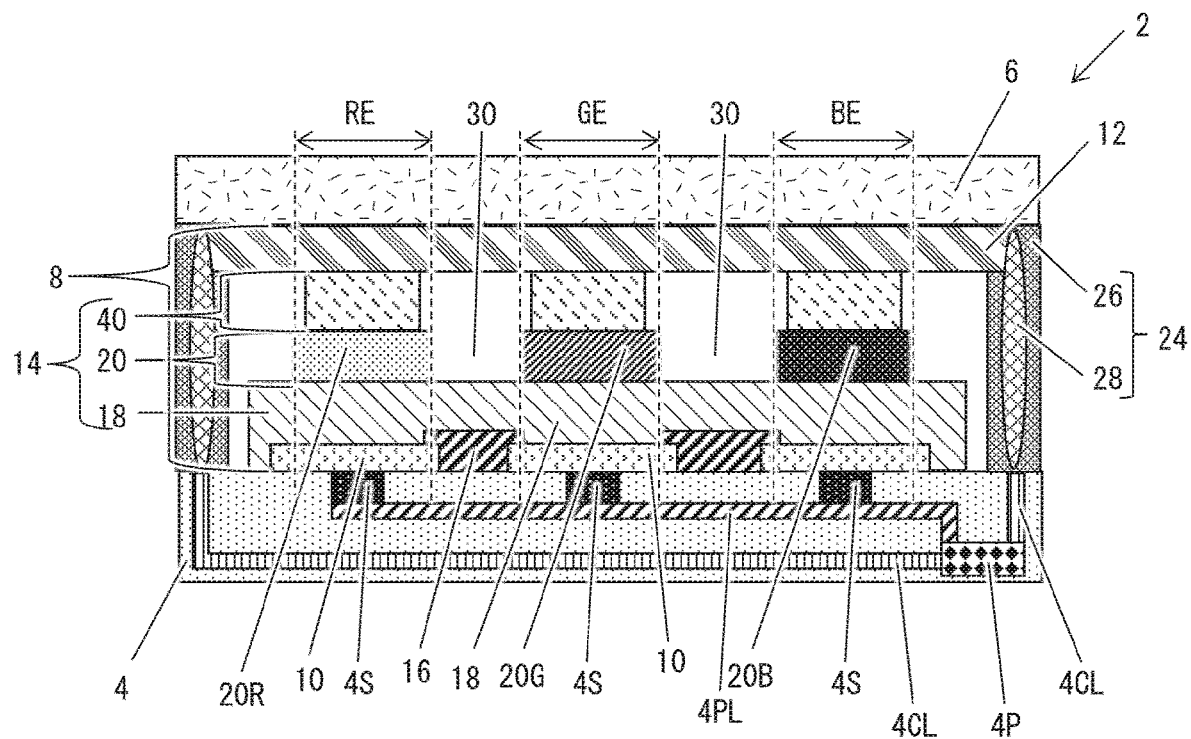
FIG. 14 is a schematic cross-sectional view of a display device in accordance with Embodiment 2.

FIG. 14 is a cross-sectional view of a display device 2 in accordance with the present embodiment. The display device 2 in accordance with the present embodiment may have the same structure as the display device 2 in accordance with the preceding embodiment, except that the former includes second charge transport layers 40 in place of the second charge transport layer 22.

The second charge transport layers 40 differs from the second charge transport layer 22 in that the former is contained in the subpixel-specific layers separately formed for the individual subpixels in the display device 2. The second charge transport layers 40 are nanoparticle layers containing nanoparticles. In other words, the second charge transport layers 40 double as the subpixel-specific layers and the nanoparticle layers. The second charge transport layers 40 may be made of the same material as the second charge transport layer 22.

Figure 15:
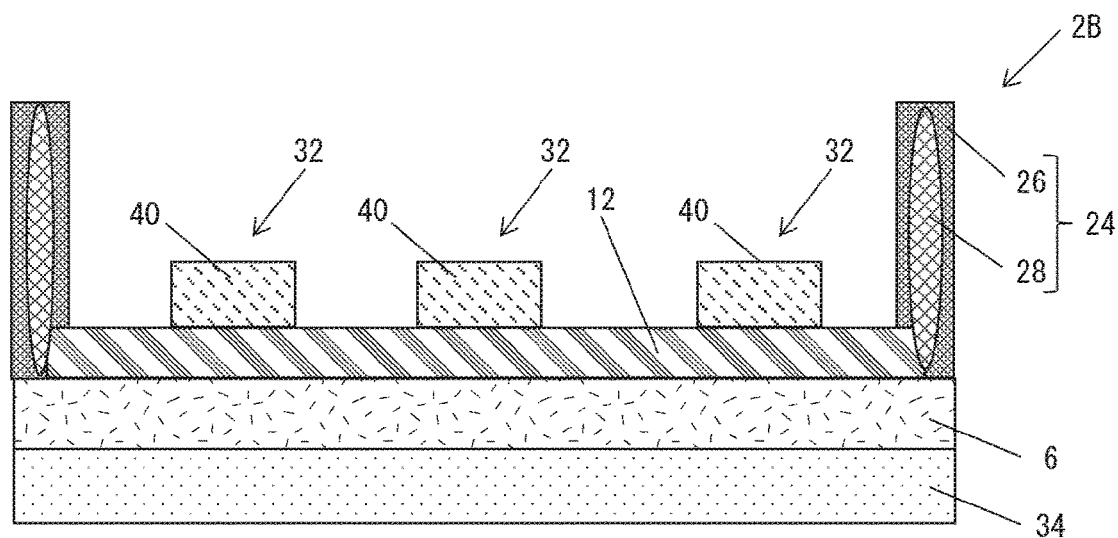
FIG. 15 is a schematic cross-sectional view of a first stack body and a second stack body in accordance with Embodiment 2.

FIG. 15 is a schematic cross-sectional view of an exemplary structure of the second stack body 2B in accordance with the present embodiment. The second stack body 2B in accordance with the present embodiment includes the insular, second charge transport layers 40 in locations that match the subpixels in the display device 2, as shown in FIG. 15. The second stack body 2B hence includes lumps 32 formed from the second charge transport layers 40.

The display device 2 in accordance with the present embodiment can be manufactured by the same techniques as the display device 2 shown in FIG. 3. The light-emitting layers 20 are subpixel-specific layers in the present embodiment. Step S6, in which the light-emitting layers 20 are formed, is therefore a subpixel-specific layer forming step in the present embodiment. Step S12 in the present embodiment is a nanoparticles forming step and doubles as a subpixel-specific layer forming step because the second charge transport layers 40 are formed in an insular fashion in locations that match the subpixels in the display device 2. The second charge transport layers 40 may be formed by, for example, lift-off, nanoimprinting, or printing. The first stack body 2A in accordance with the present embodiment may have the structure shown in FIG. 4 similarly to the preceding embodiment.

The first substrate 4 and the second substrate 6 in the present embodiment can be bonded by the same techniques as the techniques used in the above-described bonding step. The present embodiment hence advantageously improves yield in the manufacture of the display device 2 similarly to the preceding embodiment.

Variation Example 3

Figure 16:
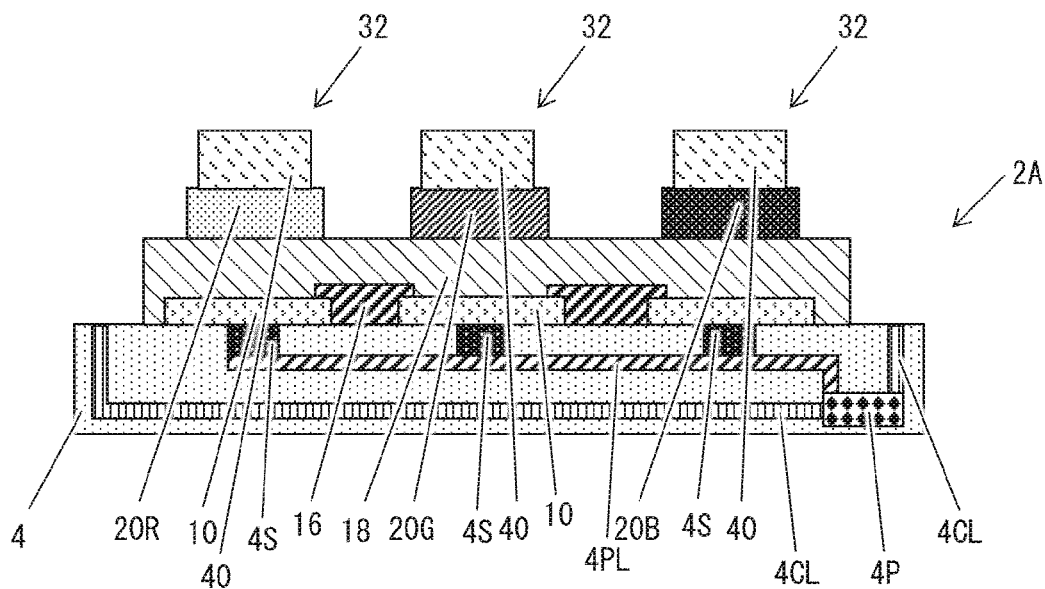
FIG. 16 is a set of schematic cross-sectional views of a first stack body and a second stack body in accordance with Variation Example 3.
Figure 16:
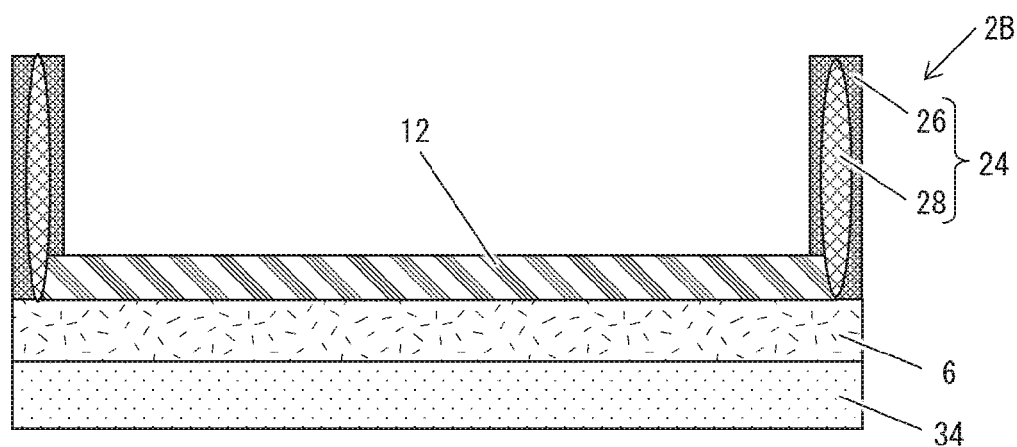

FIG. 16 is a set of schematic cross-sectional views of exemplary structures of the first stack body 2A and the second stack body 2B in accordance with the present variation example. The first stack body 2A in accordance with the present variation example differs from the first stack body 2A shown in FIG. 4 in that the former further includes second charge transport layers 40 on the light-emitting layers 20 as shown in FIG. 16. The second stack body 2B in accordance with the present variation example, when compared with the second stack body 2B shown in FIG. 15, therefore includes no second charge transport layers 40 as shown in FIG. 16. The lumps 32 are therefore formed only on the first stack body 2A in accordance with the present variation example.

Figure 17:
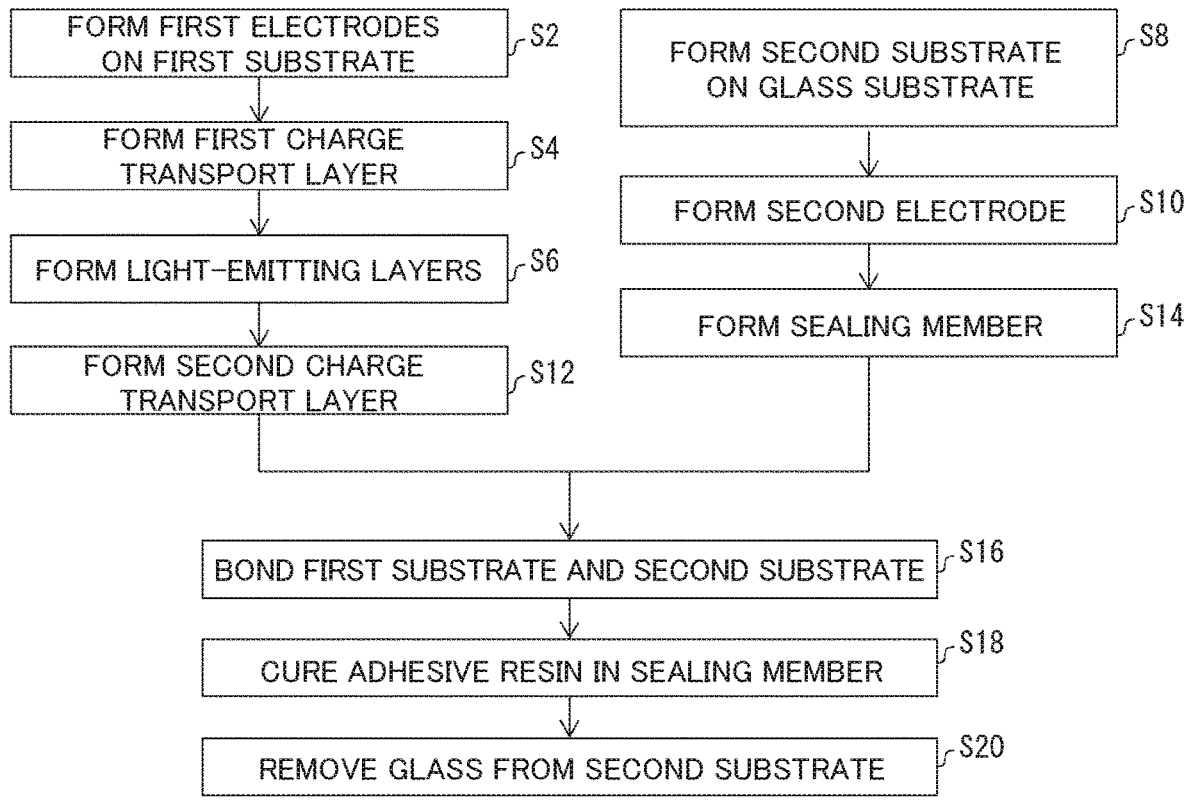
FIG. 17 is a flow chart representing a method of manufacturing a display device in accordance with Variation Example 3.

The display device 2 in accordance with the present variation example is manufactured by following the steps shown in the flow chart in FIG. 17. Firstly, steps S2, S4, and S6 described above are performed in this order. Next, step S12 described above is performed to form the insular, second charge transport layers 40, one on each of the light-emitting layers 20. The second charge transport layers 40 are nanoparticle layers as well as subpixel-specific layers. Step S12, in which the second charge transport layers 40 are formed, is therefore both a nanoparticle layer forming step and a subpixel-specific layer forming step. In the present variation example, since the second charge transport layers 40 are formed on the respective light-emitting layers 20, the second charge transport layers 40 preferably have a smaller footprint than the respective light-emitting layers 20. These steps prepare the first stack body 2A shown in FIG. 16.

Next, steps S8, S10, and S14 described above are performed in this order to prepare the second stack body 2B shown in FIG. 16. In other words, a step of forming the second electrode 12 is followed by a step of forming the sealing member 24 in the present variation example.

Lastly, steps S16, S18, and S20 described above are performed in this order to bond the first stack body 2A and the second stack body 2B together, which completes the manufacture of the display device 2 shown in, for example, FIG. 14.

The method of manufacturing the display device 2 in accordance with the present variation example provides the subpixel-specific layers containing the light-emitting layers 20 and the second charge transport layers 40 only on the first substrate 4. Furthermore, the method of manufacturing the display device 2 in accordance with the present variation example provides the second charge transport layers 40, which are nanoparticle layers, only in locations that overlap the subpixel-specific layers. This particular structure in accordance with the present variation example facilitates the provision of the cavities 30 and also simplifies the structure of the second stack body 2B including the second substrate 6, which leads to simplification of the manufacture of the second stack body 2B.

The second charge transport layers 40 are provided on the first substrate 4 in the present variation example. In other words, the second charge transport layers 40 are separately provided on the respective light-emitting layers 20. That eliminates the need to strictly align the first stack body 2A and the second stack body 2B in the bonding step. The present variation example thereby facilitates the bonding of the first stack body 2A and the second stack body 2B.

Embodiment 3

Figure 18:
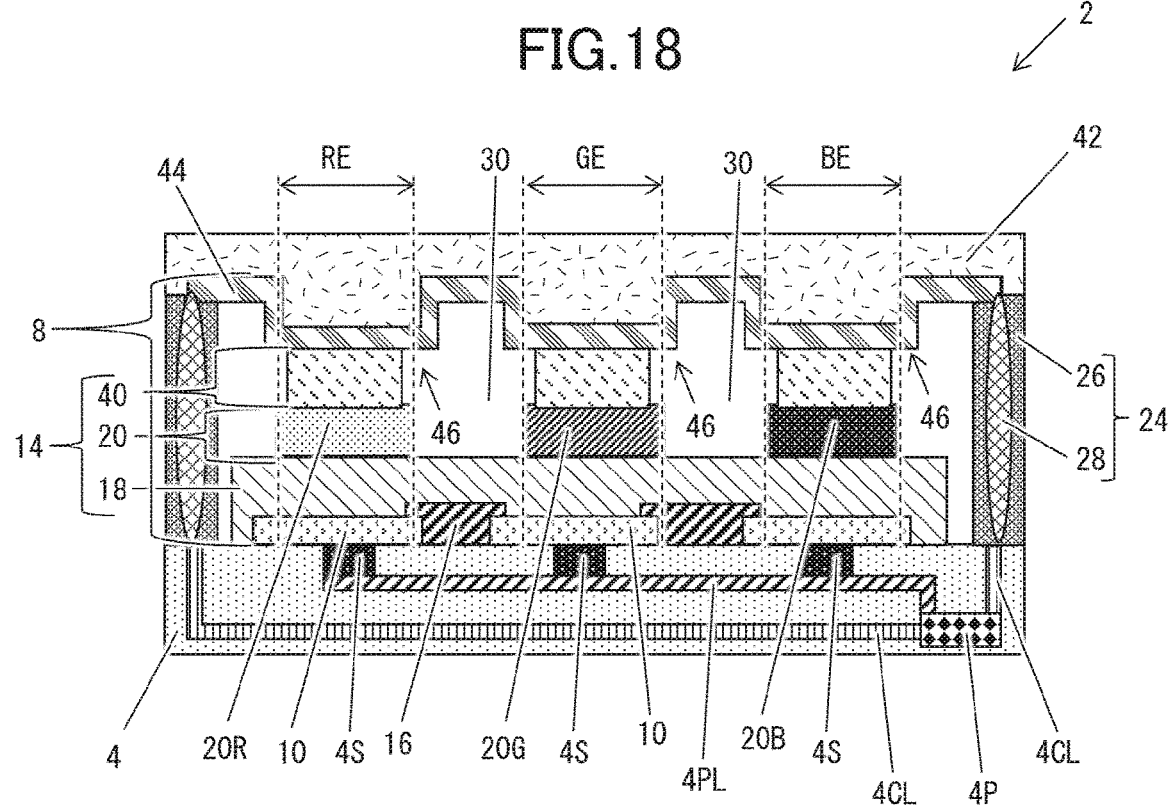
FIG. 18 is a schematic cross-sectional view of a display device in accordance with Embodiment 3.

FIG. 18 is a cross-sectional view of a display device 2 in accordance with the present embodiment. The display device 2 in accordance with the present embodiment differs from the display devices 2 in accordance with the preceding embodiments in that the former includes a second substrate 42 in place of the second substrate 6. The second substrate 42 includes a second electrode 44 formed thereon in place of the second electrode 12. The display device 2 in accordance with the present embodiment has otherwise the same structure as the display devices 2 in accordance with the preceding embodiments.

The second electrode 44 includes second electrode lumps 46 projecting toward the respective first electrodes 10 in the present embodiment. The second electrode lumps 46 are provided in locations that match the respective subpixels in the display device 2.

Figure 19:
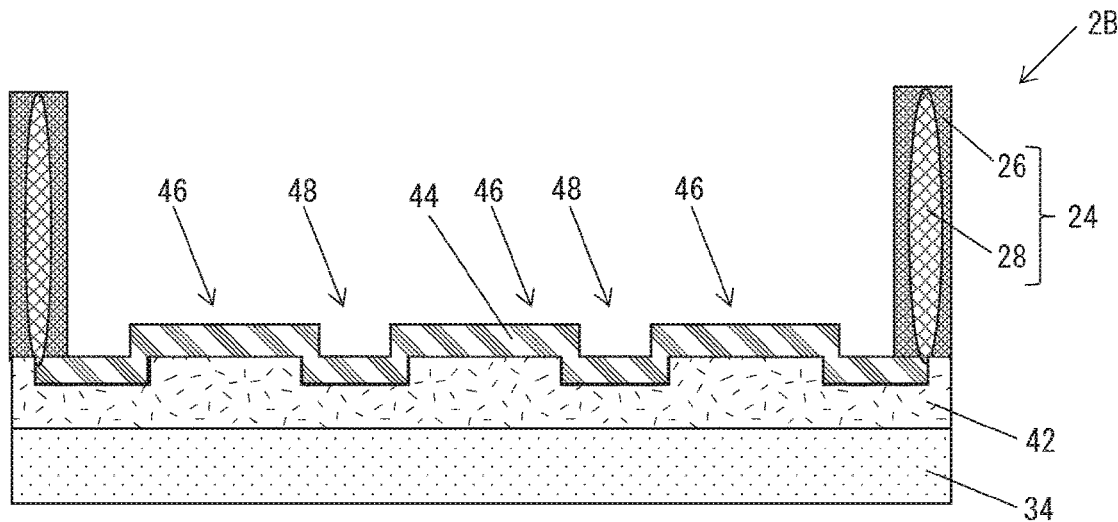
FIG. 19 is a schematic cross-sectional view of a second stack body in accordance with Embodiment 3.

FIG. 19 is a schematic cross-sectional view of an exemplary structure of a second stack body 2B in accordance with the present embodiment. The second stack body 2B in accordance with the present embodiment has the same structure as the second stack body 2B shown in FIG. 16, except that the former includes the second substrate 42 in place of the second substrate 6 and the second electrode 44 in place of the second electrode 12.

The second stack body 2B in accordance with the present embodiment includes the second substrate 42 having second substrate dents 48 formed therein as shown in FIG. 19. The second substrate dents 48 are provided between locations that match the subpixels in the display device 2 in the present embodiment. The second substrate dents 48 may be formed by partially etching out the planar, second substrate 42 in step S8 shown in FIG. 3.

Since the second electrode 44 is provided on the second substrate 42 having the second substrate dents 48 therein, the second electrode lumps 46 are provided around the respective second substrate dents 48. The first stack body 2A in accordance with the present embodiment may have the structure shown in FIG. 16 similarly to Variation Example 3 described above.

In the display device 2 in accordance with the present embodiment, the second electrode 44 includes the second electrode lumps 46 projecting toward the respective first electrodes 10 in locations that match the respective subpixels in the display device 2. This particular structure facilitates the provision of the cavities 30 and further lowers the risk of short-circuiting between the subpixels.

Variation Example 4

Figure 20:
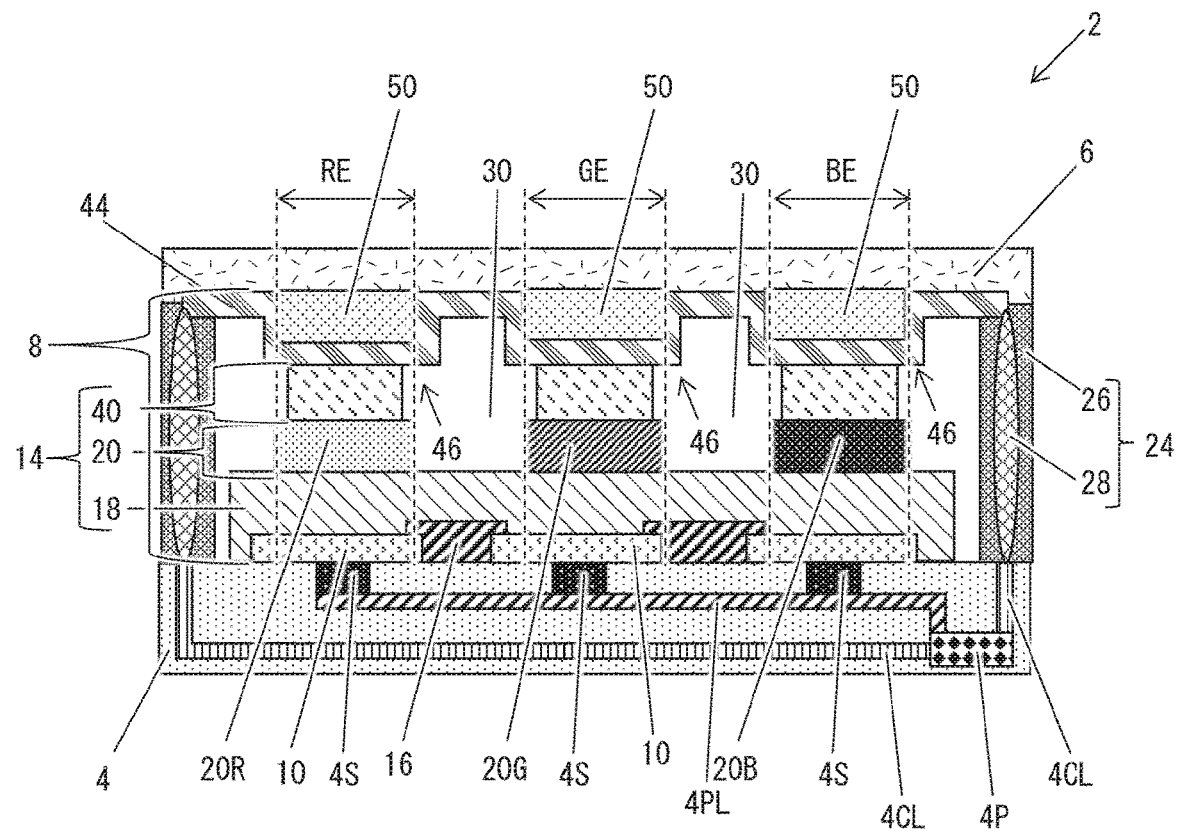
FIG. 20 is a schematic cross-sectional view of a display device in accordance with Variation Example 4.

FIG. 20 is a cross-sectional view of the display device 2 in accordance with the present variation example. The display device 2 in accordance with the present variation example has the same structure as the display device 2 in accordance with the present embodiment, except that the former includes the aforementioned second substrate 6 in place of the second substrate 42 and a visible-light transmissive resin 50 between the second substrate 6 and the second electrode 44.

The visible-light transmissive resin 50 is provided in locations that match the subpixels in the display device 2. The visible-light transmissive resin 50 is transmissive to light in the visible range, and in particular transmissive to light emitted by the light-emitting layers 20.

Figure 21:
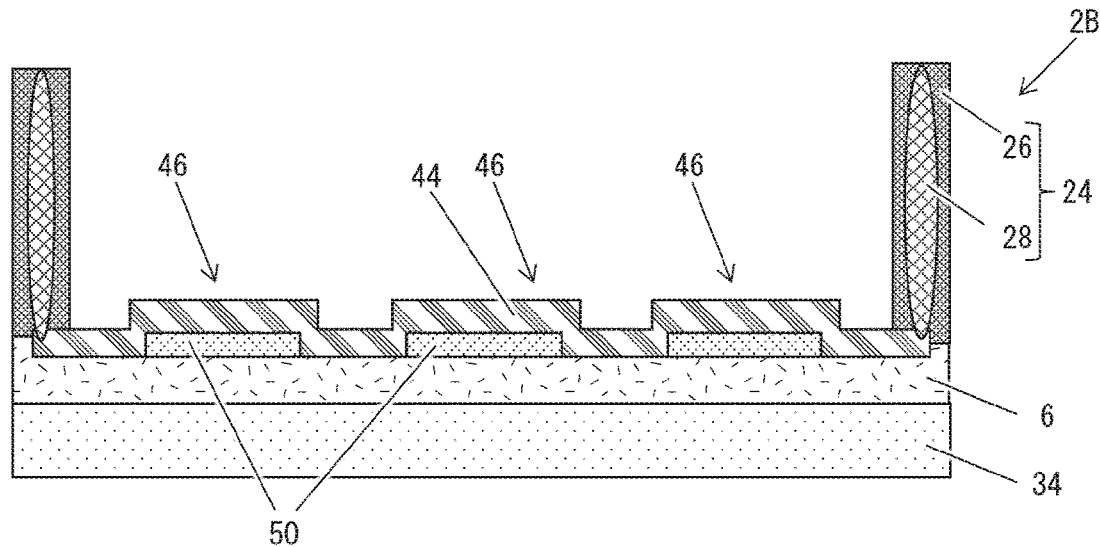
FIG. 21 is a schematic cross-sectional view of a second stack body in accordance with Variation Example 4.

FIG. 21 is a schematic cross-sectional view of an exemplary structure of the second stack body 2B in accordance with the present variation example. The second stack body 2B in accordance with the present variation example includes the visible-light transmissive resin 50 in locations that match the subpixels in the display device 2 on the planar, second substrate 6. The second stack body 2B shown in FIG. 21 therefore includes the second electrode lumps 46 in locations inclusive of the side and top faces of the visible-light transmissive resin 50. The visible-light transmissive resin 50 may be formed by a publicly known, technique between step S8 and step S10 shown in FIG. 3.

The display device 2 in accordance with the present variation example achieves the same advantages as the display device 2 in accordance with the present embodiment.

Variation Example 5

Figure 22:
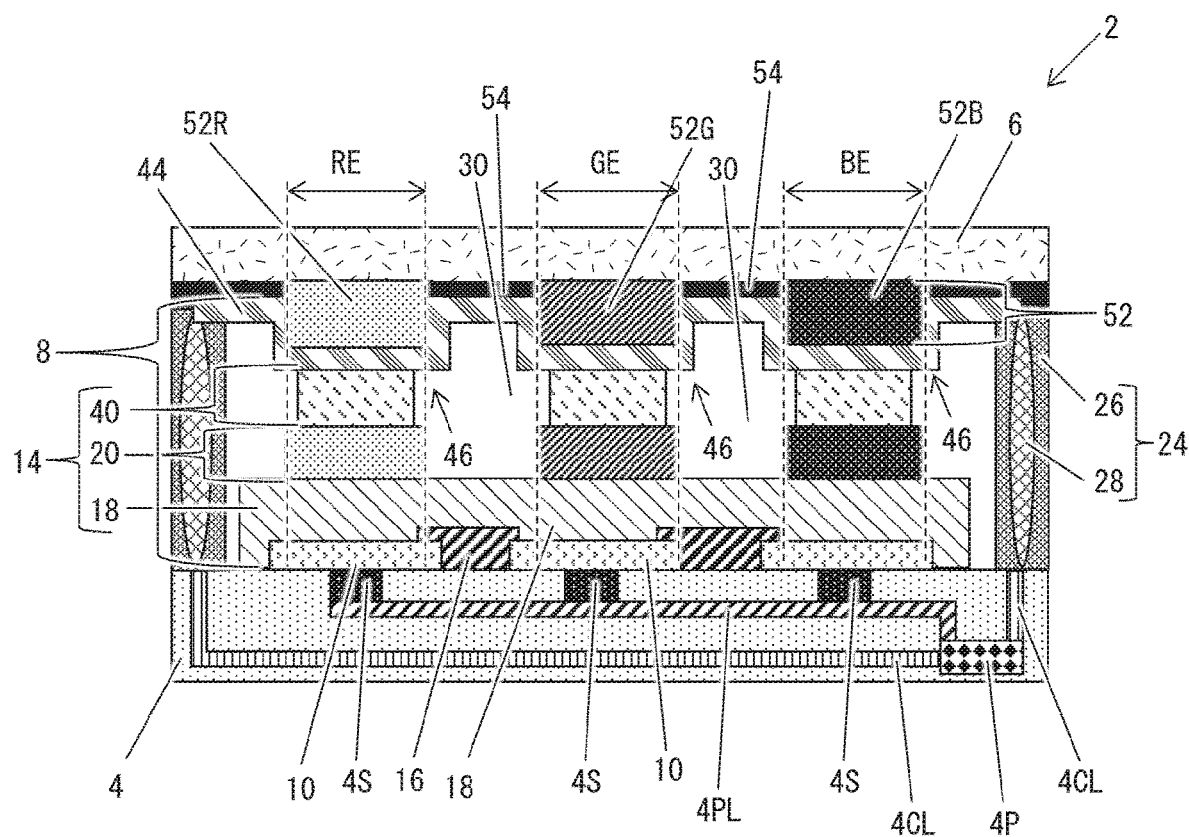
FIG. 22 is a schematic cross-sectional view of a display device in accordance with Variation Example 5.

FIG. 22 is a cross-sectional view of the display device 2 in accordance with the present variation example. The display device 2 in accordance with the present variation example differs from the display device 2 in accordance with the immediately preceding variation example in that the former includes light-absorption layers 52 and light-blocking layers 54 on the second substrate 6.

The light-absorption layers 52 are provided in locations that overlap the light-emitting layers 20. Each light-absorption layer 52 absorbs light of a color that is complementary to specific light from the light emitted by the light-emitting layers 20 and in particular absorbs light of a color that is complementary to the light emitted by the light-emitting layer 20 provided in a location that overlaps the light-absorption layer 52.

The light-absorption layers 52 include first complementary color light-absorption layers 52R that absorb light of a color that is complementary to red light in locations that overlap the first light-emitting layer 20R. Likewise, the light-absorption layers 52 include second complementary color light-absorption layers 52G that absorb light of a color that is complementary to green light in locations that overlap the second light-emitting layer 20G. Additionally, the light-absorption layers 52 include third complementary color light-absorption layers 52B that absorb light of a color that is complementary to blue light in locations that overlap the third light-emitting layer 20B.

The light-blocking layers 54 block visible light and in particular the light emitted by the light-emitting layers 20. The light-blocking layers 54 are provided in locations that overlap gaps between the light-emitting layers 20. The light-blocking layers 54 are provided between the light-absorption layers 52 as shown in, for example, FIG. 22. The light-blocking layers 54 are thinner than the light-absorption layers 52.

Figure 23:
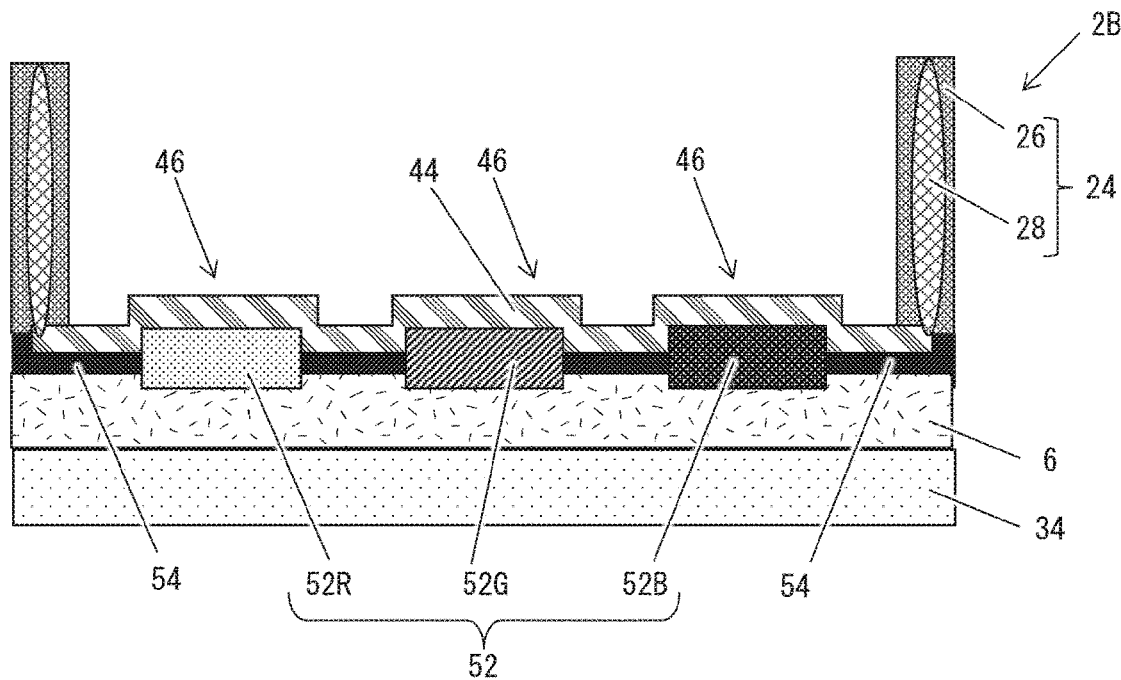
FIG. 23 is a schematic cross-sectional view of a second stack body in accordance with Variation Example 5.

FIG. 23 is a schematic cross-sectional view of an exemplary structure of the second stack body 2B in accordance with the present variation example. The second stack body 2B in accordance with the present variation example includes the light-absorption layers 52 on the planar, second substrate 6 in locations that match the subpixels in the display device 2 and also includes the light-blocking layers 54 on the planar, second substrate 6 between locations that match the subpixels in the display device 2.

Since the light-absorption layers 52 are thicker than the light-blocking layers 54, the second stack body 2B shown in FIG. 23 includes the second electrode lumps 46 in locations inclusive of the side and top faces of the light-absorption layers 52.

The display device 2 in accordance with the present variation example achieves the same advantages as the display device 2 in accordance with the immediately preceding variation example. The display device 2 in accordance with the present variation example includes light-absorption layers on the second substrate 6 of the light-emitting layers 20. This particular structure enables the display device 2 in accordance with the present variation example to absorb some of external light coming into the display device 2, thereby reducing the influence of reflected external light.

The display device 2 in accordance with the present variation example includes the light-absorption layers 52 to absorb light of a color that is complementary to the light emitted by the light-emitting layers 20 for the subpixels. The display device 2 in accordance with the present variation example hence improves the chromaticity of the light emitted by the light-emitting layers 20 for the subpixels and reduces stray light.

The display device 2 in accordance with the present variation example further includes the light-blocking layers 54 between the subpixels to block visible light, thereby reducing the stray light coming from the light-emitting layers 20.

Embodiment 4

Figure 24:
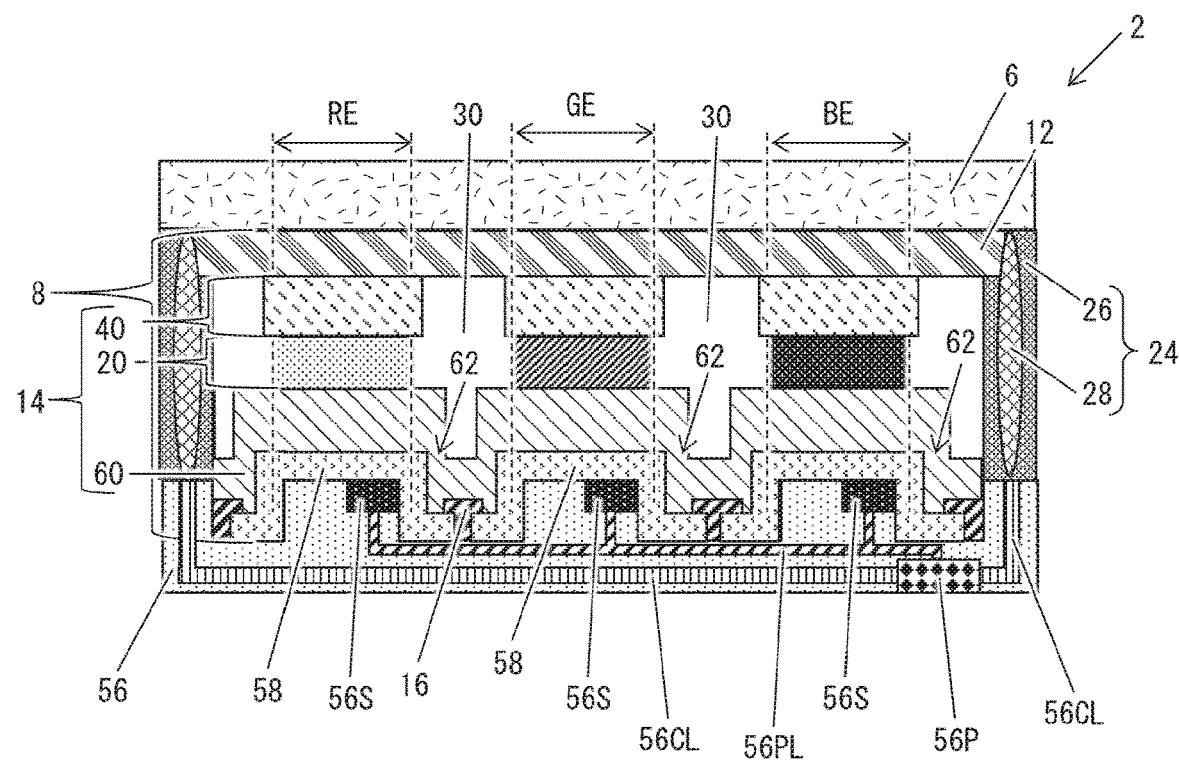
FIG. 24 is a schematic cross-sectional view of a display device in accordance with Embodiment 4.

FIG. 24 is a cross-sectional view of a display device 2 in accordance with the present embodiment. The display device 2 in accordance with the present embodiment differs from the display device 2 in accordance with Embodiment 2 in that the former includes a first substrate 56 in place of the first substrate 4. The first substrate 56 includes first electrodes 58 in place of the first electrodes 10. The display device 2 includes a first charge transport layer 60 in place of the first charge transport layer 18. The first charge transport layer 60 is a nanoparticle layer. The display device 2 in accordance with the present embodiment has otherwise the same structure as the display device 2 in accordance with Embodiment 2.

The first substrate 56 may include routing lines 4PL for connecting to the subpixel circuits to individually drive the first electrodes 58, similarly to the first substrate 4. The first substrate 56 may further include a routing line 56CL for electrically connecting to the conductive particles 28. The first substrate 56 may further include a power supply 56P connected to routing lines 56PL and the routing line 56CL.

The power supply 56P may apply voltage to the first electrodes 58 via the routing lines 56PL. The voltage applied to the first electrodes 58 may be controlled through switching elements 56S. Each switching element 56S includes, for example, a thin film transistor and is provided between an associated one of the first electrodes 58 and an associated one of the routing lines 56PL. The power supply 56P may similarly apply voltage to the second electrode 12 via the routing line 56CL.

Each first electrode 58 in accordance with the present embodiment includes a first electrode lump 62 projecting toward the second electrode 12. The first electrode lumps 62 are provided in locations that match the subpixels in the display device 2. The edge cover 16 is provided around the first electrode lumps 62 to separate the first electrodes 58 for the subpixels in the display device 2 in the present embodiment.

The first charge transport layer 60 is provided commonly on the first substrate 56 having the first electrode lumps 62 in the present embodiment. The first charge transport layer 60 therefore has an irregular surface that reflects the shape of the first electrode lumps 62. In the present embodiment, the first charge transport layer 60 may be formed by applying a colloidal solution of dispersed nanoparticles on the first electrodes 58, for example, using a coater or by inkjet printing or screen printing.

Figure 25:
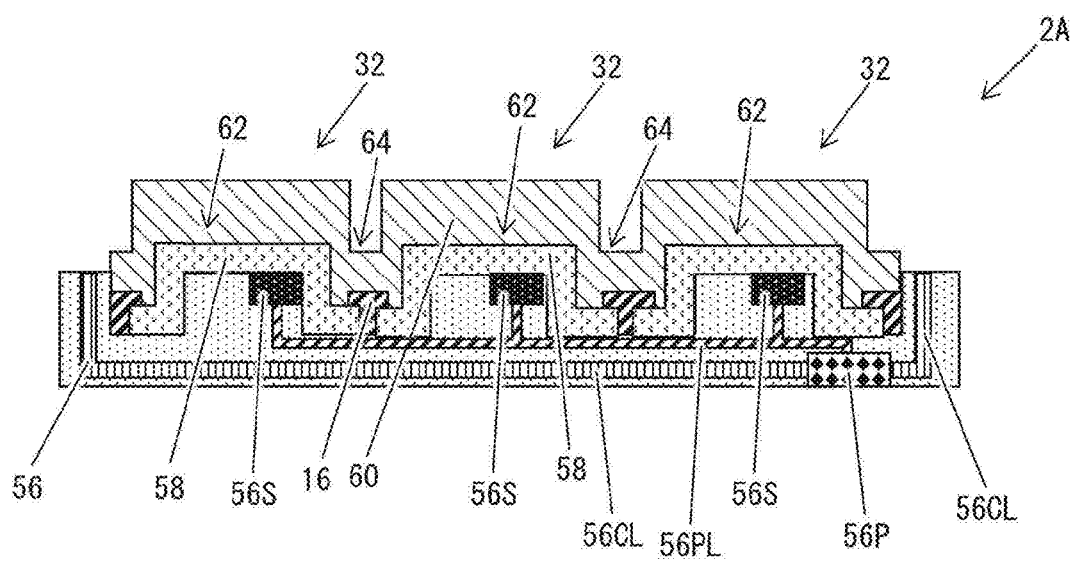
FIG. 25 is a set of schematic cross-sectional views of a first stack body in accordance with Embodiment 4.
Figure 25:
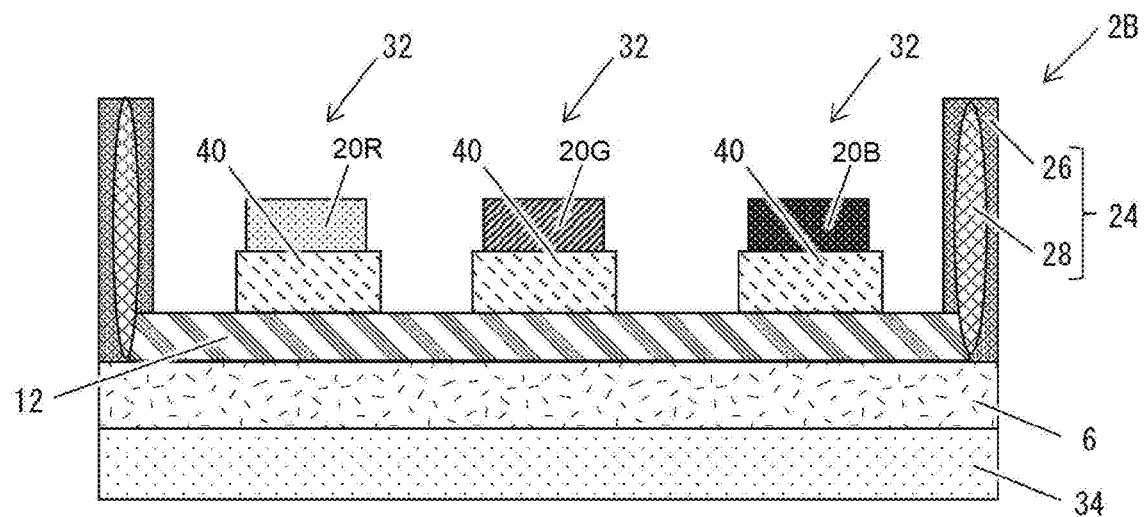

FIG. 25 is a set of schematic cross-sectional views of exemplary structures of the first stack body 2A and the second stack body 2B in accordance with the present embodiment. The first stack body 2A in accordance with the present embodiment differs from the first stack body 2A shown in FIG. 12 in that the former includes the first substrate 56 in place of the first substrate 4 and the first electrodes 58 in place of the first electrodes 10 as shown in FIG. 25. The first stack body 2A in accordance with the present embodiment further includes the first charge transport layer 60 in place of the first charge transport layer 18. The first stack body 2A in accordance with the present embodiment has otherwise the same structure as the first stack body 2A shown in FIG. 12.

The first stack body 2A in accordance with the present embodiment includes the first substrate 56 having first substrate dents 64 formed therein as shown in FIG. 25. The first substrate dents 64 are provided between locations that match the subpixels in the display device 2 in the present embodiment. The first substrate dents 64 may be formed by partially etching out the planar, first substrate 56 prior to step S2 shown in FIG. 3. Alternatively, the first substrate dents 64 may be formed by thinning down parts of a planarization layer formed on drive elements included in the first substrate 56.

Since the first electrodes 58 are provided on the first substrate 56 having the first substrate dents 64 therein, the first electrode lumps 62 are provided around the respective first substrate dents 64. The edge cover 16 is provided in locations that overlap the first substrate dents 64. In addition, since the first charge transport layer 60 reflects the shape of the first electrode lumps 62, the first stack body 2A includes the lumps 32 in locations that match the subpixels in the display device 2 despite that the first charge transport layer 60 is provided commonly.

The second stack body 2B in accordance with the present embodiment has the same structure as the second stack body 2B shown in FIG. 12, except that the former includes the second charge transport layers 40 in place of the second charge transport layer 38 as shown in FIG. 25. The second charge transport layers 40 are subpixel-specific layers. The second stack body 2B in accordance with the present embodiment can be therefore manufactured by the same techniques as the second stack body 2B shown in FIG. 12, except that the second charge transport layers 40 are separately formed for individual subpixels.

The display device 2 in accordance with the present embodiment includes the first electrode lumps 62, which project from the first electrodes 58 toward the second electrode 12, in locations that match the subpixels in the display device 2. This particular structure facilitates the provision of the cavities 30 and further lowers the risk of short-circuiting between the subpixels. Particularly, in the present embodiment, since the lumps 32 are provided on both the first stack body 2A and the second stack body 2B, the structure facilitates the provision of the cavities 30.

The method of manufacturing the display device 2 in accordance with the present embodiment provides the subpixel-specific layers containing the light-emitting layers 20 and the second charge transport layers 40 only on the second substrate 6. The present embodiment therefore facilitates the provision of the cavities 30 and also simplifies the structure of the first stack body 2A including the first substrate 56, which leads to simplification of the manufacture of the first stack body 2A.

Variation Example 6

Figure 26:
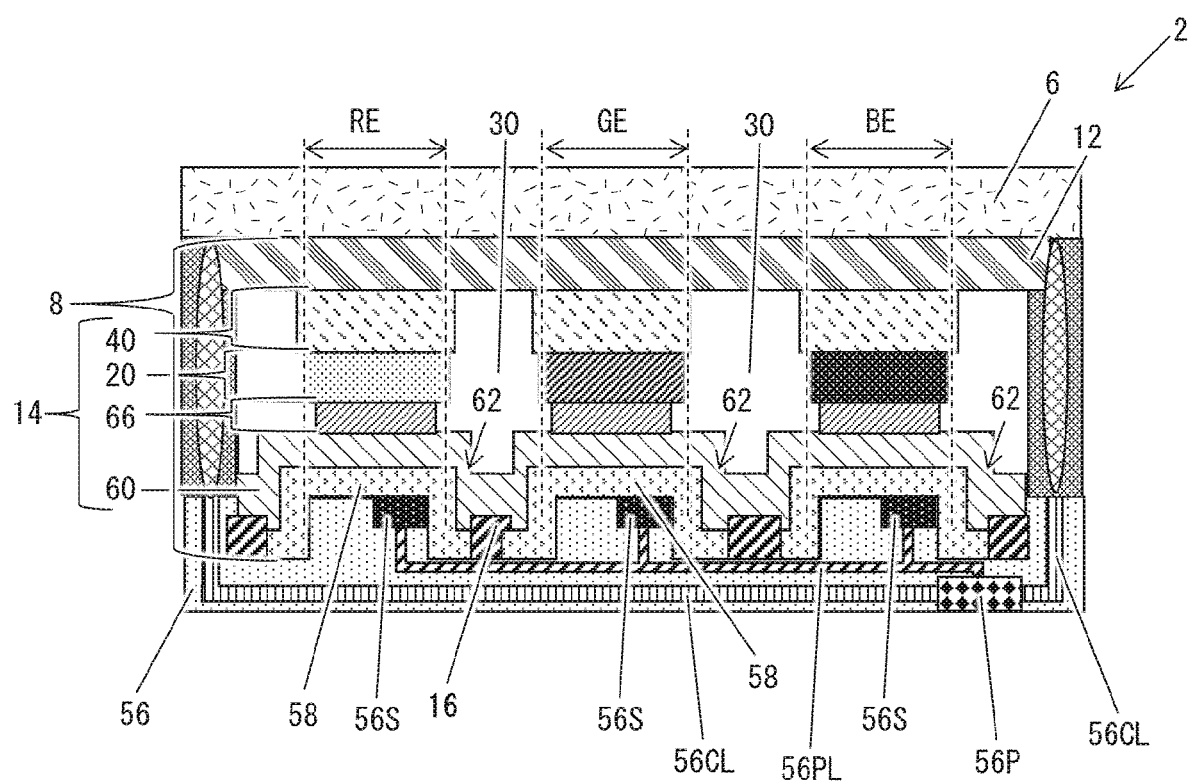
FIG. 26 is a schematic cross-sectional view of a display device in accordance with Variation Example 6.

FIG. 26 is a cross-sectional view of the display device 2 in accordance with the present variation example. The display device 2 in accordance with the present variation example has the same structure as the display device 2 in accordance with the present embodiment, except that the former further includes subpixel-specific charge transport layers 66 between the first charge transport layer 60 and the light-emitting layers 20.

The subpixel-specific charge transport layers 66 are separately provided in locations that overlap the light-emitting layers 20. In other words, the subpixel-specific charge transport layers 66 are provided respectively for the subpixels in the display device 2. The subpixel-specific charge transport layers 66 may contain the same electronic transport material as the first charge transport layer 60.

Both the first charge transport layer 60 and the subpixel-specific charge transport layers 66 may be nanoparticle layers containing nanoparticles as a charge transport material. In the present embodiment, the light-emitting layers 20 and the subpixel-specific charge transport layers 66 may be designed to have the same thickness in each light-emitting element.

Figure 27:
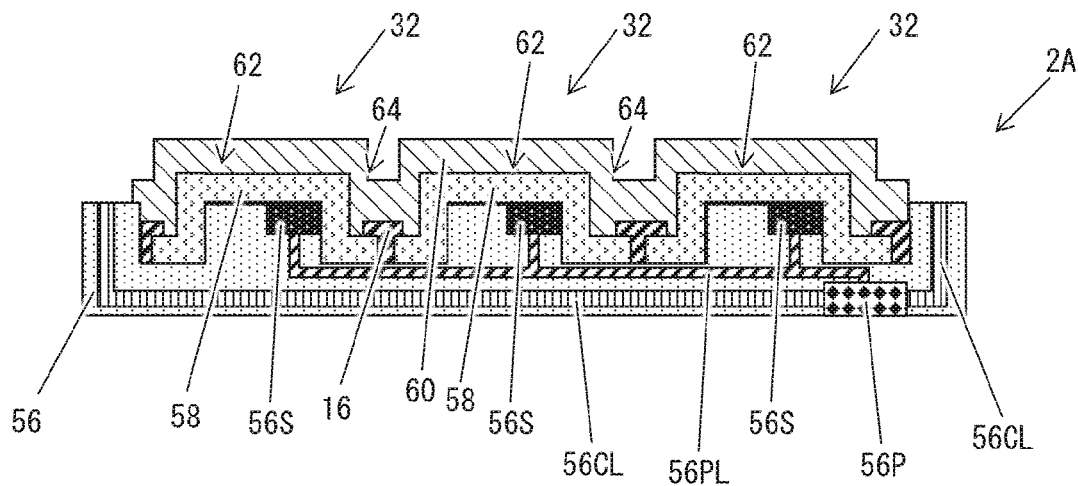
FIG. 27 is a set of schematic cross-sectional views of a first stack body and a second stack body in accordance with Variation Example 6.
Figure 27:
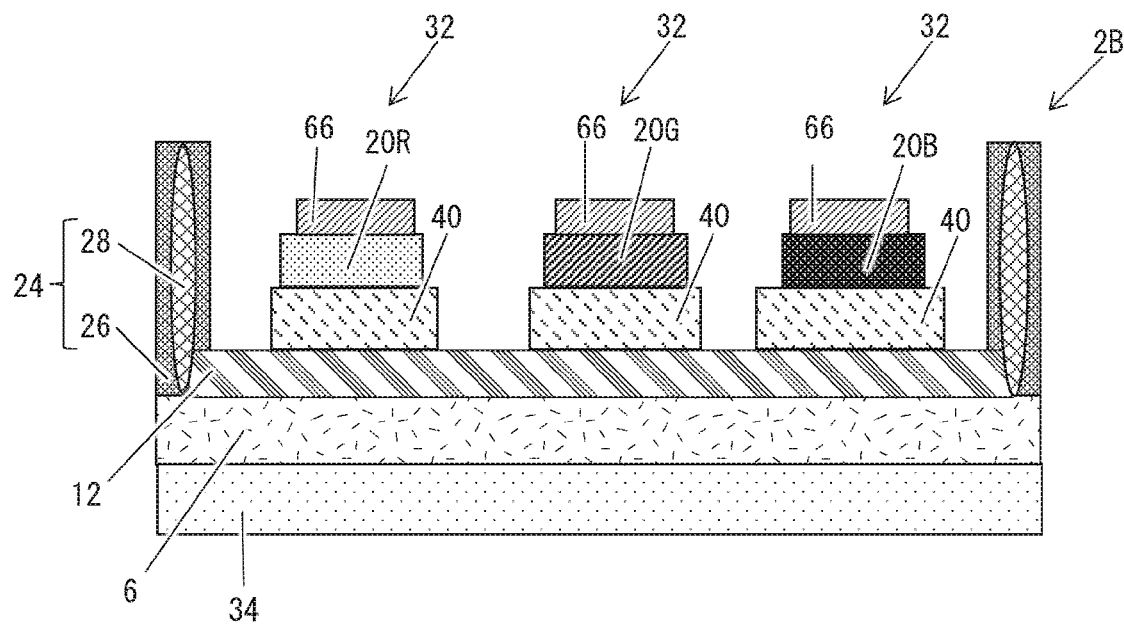

FIG. 27 is a set of schematic cross-sectional views of exemplary structures the first stack body 2A and the second stack body 2B in accordance with the present variation example.

The first stack body 2A in accordance with the present variation example may have the same structure as the first stack body 2A shown in FIG. 25, except that the first charge transport layer 60 in the former is reduced in thickness by as much as the thickness of the subpixel-specific charge transport layer 66 as shown in FIG. 27.

The second stack body 2B in accordance with the present variation example may have the same structure the second stack body 2B shown in FIG. 25, except that the former further include the subpixel-specific charge transport layers 66 on the respective light-emitting layers 20 as shown in FIG. 27.

Figure 28:
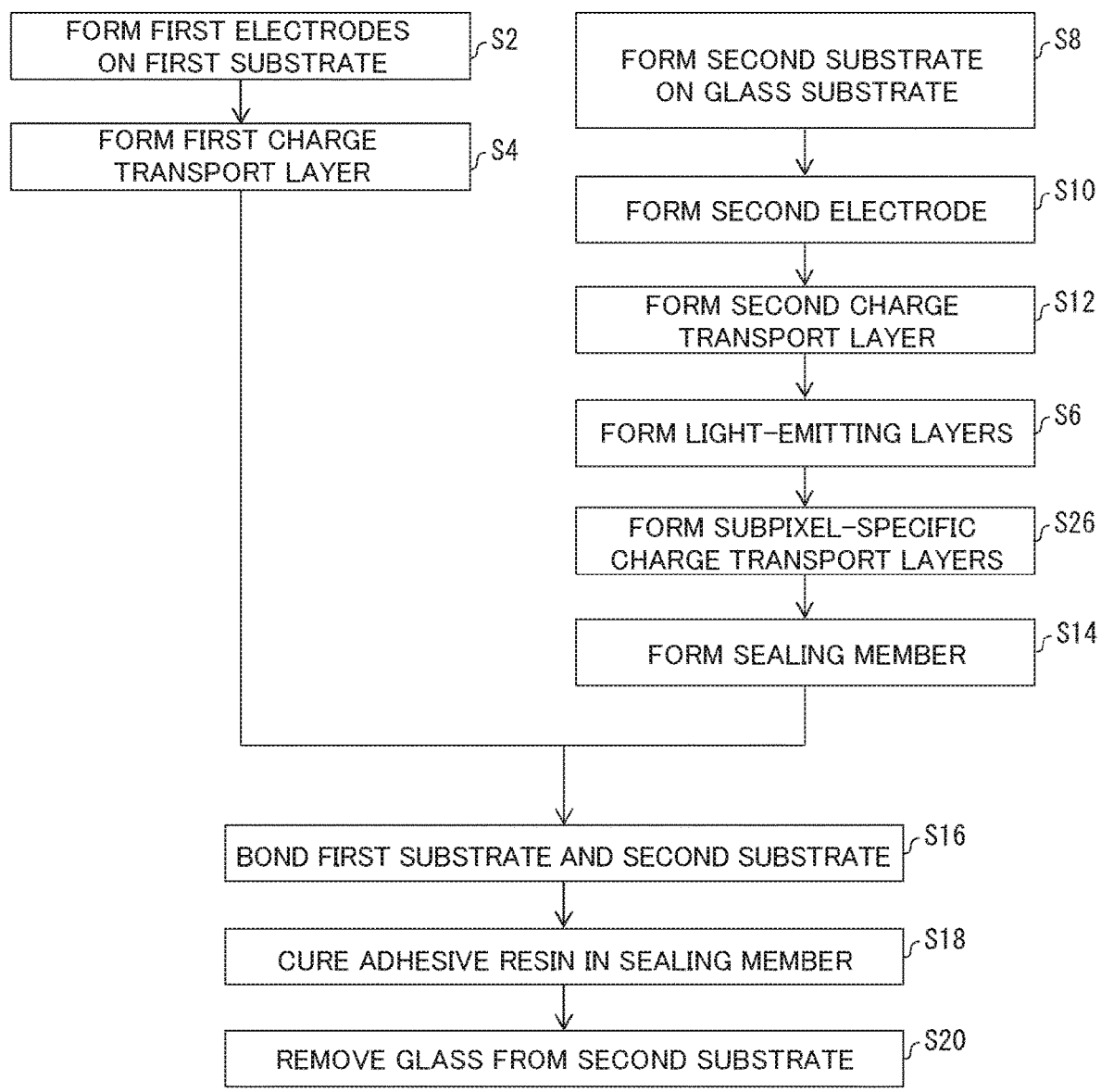
FIG. 28 is a flow chart representing a method of manufacturing the display device in accordance with Variation Example 6.

The display device 2 in accordance with the present variation example is manufactured by following the steps shown in the flow chart in FIG. 28. Firstly, steps S2 and S4 described above are performed in this order to prepare the first stack body 2A shown in FIG. 27. In step S4, the first charge transport layer 60 may be formed by applying a colloidal solution of dispersed nanoparticles on the first electrodes 58, for example, using a coater or by inkjet printing or screen printing.

Next, steps S8, S10, S12, and S6 described above are performed in this order. Then, the subpixel-specific charge transport layers 66 are formed on the respective light-emitting layers 20 by, for example, lift-off, nanoimprinting, or printing (step S26). In other words, the step of forming the second charge transport layers is immediately followed further by the step of forming the subpixel-specific charge transport layers 66 in the present variation example. Next, step S14 described above is performed to prepare the second stack body 2B shown in FIG. 27.

Lastly, steps S16, S18, and S20 described above are performed in this order to bond the first stack body 2A and the second stack body 2B together, which completes the manufacture of the display device 2 shown in, for example, FIG. 26.

The display device 2 in accordance with the present variation example achieves the same advantages as the display device 2 in accordance with the present embodiment. In the display device 2 in accordance with the present variation example, if both the first stack body 2A and the second stack body 2B include a nanoparticle layer as the topmost face thereof, the nanoparticle layers are bonded together in the bonding step. The repositioning of the nanoparticles in the bonding step therefore can more effectively deliver the aforementioned advantages.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A display device comprising:
a plurality of subpixels;
light-emitting elements, one for each of the plurality of subpixels;
first electrodes, one for each of the plurality of subpixels;
a second electrode common to the plurality of subpixels;
subpixel-specific layers, one for each of the plurality of subpixels, between the first electrodes and the second electrode; and
a nanoparticle layer between the first electrodes and the second electrode, the nanoparticle layer being common to the plurality of subpixels and including a stack of nanoparticles, wherein
the nanoparticles have an average density that is higher in locations that overlap the subpixel-specific layers than in locations that overlap gaps between adjacent pairs of the subpixel-specific layers in the nanoparticle layer, and
in each of the light-emitting elements, the nanoparticle layer is provided on a corresponding subpixel-specific layer.

2. The display device according to claim 1, wherein
the light-emitting elements include functional layers, respectively, in locations that overlap the first electrodes and the second electrode, each of the functional layers includes a stack of a first charge transport layer, a light-emitting layer, and a second charge transport layer that are arranged in this order when viewed from the first electrodes,
the subpixel-specific layers and the nanoparticle layer double as at least one of layers in the functional layer, and
the display device further comprises light-absorption layers opposite the respective light-emitting layers from the second electrode, the light-absorption layers overlap the respective light-emitting layers and being configured to absorb light of a color that is complementary to light emitted by the respective light-emitting layers.

3. A display device comprising:
a plurality of subpixels;
light-emitting elements, one for each of the plurality of subpixels;
first electrodes, one for each of the plurality of subpixels;
a second electrode common to the plurality of subpixels;
subpixel-specific layers, one for each of the plurality of subpixels, between the first electrodes and the second electrode;
a nanoparticle layer between the first electrodes and the second electrode, the nanoparticle layer including a stack of nanoparticles;
a sealing member between the first electrodes and the second electrode, the sealing member overlapping a part of the second electrode and adhering to the second electrode;
a first substrate including the first electrodes; and
a second substrate opposite the first substrate, the second substrate including the second electrode, wherein
in each of the light-emitting elements, the nanoparticle layer is provided on a corresponding subpixel-specific layer,
the nanoparticle layer is common to the plurality of subpixels,
at least one of the first substrate and the second substrate includes protrusions in locations that overlap the first electrodes, the protrusions projecting toward an opposite substrate,
the nanoparticle layer is provided in locations that overlap the protrusions,
the nanoparticles have an average density that is higher in locations that overlap the subpixel-specific layers than in locations that overlap gaps between adjacent pairs of the subpixel-specific layers in the nanoparticle layer, the display device further comprises a cavity between:
each adjacent pair of the subpixel-specific layers, and
the first substrate and the second substrate, no cavities are provided, in locations that overlap the protrusions, between the first substrate and the second substrate, the sealing member contains conductive particles and resides between the first substrate and the second substrate, and the first substrate includes a routing line electrically conductive to the second electrode via the conductive particles.

4. A method of manufacturing a display device including a plurality of subpixels, and light-emitting elements, one for each of the plurality of subpixels, the method comprising:
preparing a first substrate including first electrodes, one for each of the plurality of subpixels;
preparing a second substrate including a second electrode;
forming subpixel-specific layers, one for each of the first electrodes, on at least one of a top face of the first substrate on which the first electrodes are provided and a top face of the second substrate on which the second electrode is provided;
forming a nanoparticle layer including a stack of nanoparticles on at least one of a topmost face of the first substrate on which the first electrodes are provided and a topmost face of the second substrate on which the second electrode is provided; and
bonding the first substrate and the second substrate together via the nanoparticle layer in such a manner that the first electrodes face the second electrode.

5. The method according to claim 4, wherein
forming the nanoparticle layer includes forming the nanoparticle layer by applying the nanoparticles dispersed in a solution, and
bonding the first substrate and the second substrate includes repositioning the nanoparticles in the nanoparticle layer.

6. The method according to claim 4, wherein bonding the first substrate and the second substrate includes forming a cavity between:
each adjacent pair of the subpixel-specific layers, and
the first substrate and the second substrate.

7. The method according to claim 4, wherein
prior to the bonding of the first substrate and the second substrate, protrusions are formed in locations on at least one of the first substrate and the second substrate on which the nanoparticle layer is provided, the locations matching the respective first electrodes, the protrusions projecting toward an opposite substrate, and
bonding the first substrate and the second substrate includes bringing the first substrate and the second substrate in contact with each other via the nanoparticle layer in locations that overlap the protrusions.

8. The method according to claim 4, wherein preparing the second substrate includes forming the second electrode by sputtering.

9. The method according to claim 4, wherein
forming the subpixel-specific layers includes forming the subpixel-specific layers only on the first substrate, and
forming the nanoparticle layer includes forming the nanoparticle layer only in locations that overlap the subpixel-specific layers.

10. The method according to claim 4, wherein
forming the subpixel-specific layers includes forming the subpixel-specific layers only on the second substrate, and
forming the nanoparticle layer includes forming the nanoparticle layer only in locations that overlap the subpixel-specific layers.

11. The method according to claim 4, wherein
forming the subpixel-specific layers includes forming the subpixel-specific layers only on the first substrate, and
forming the nanoparticle layer includes forming the nanoparticle layer only on the second substrate.

12. The method according to claim 4, wherein
forming the subpixel-specific layers includes forming the subpixel-specific layers only on the second substrate, and
forming the nanoparticle layer includes forming the nanoparticle layer only on the first substrate.

13. The method according to claim 4, wherein
forming the subpixel-specific layers includes forming some of the subpixel-specific layers on the first substrate and forming other subpixel-specific layers on the second substrate, and
forming the nanoparticle layer includes forming the nanoparticle layer on the first substrate and the second substrate.

14. The method according to claim 4, wherein preparing the first substrate includes forming first electrode protrusions on the first electrodes, the first electrode protrusions projecting toward the respective subpixel-specific layers.

15. The method according to claim 14, wherein preparing the first substrate includes forming an edge cover around the first electrode protrusions, the edge cover isolating the first electrodes from each other for each of the plurality of subpixels.

16. The method according to claim 4, wherein preparing the second substrate includes forming second electrode protrusions on the second electrode, the second electrode protrusions projecting toward the respective subpixel-specific layers.

17. The method according to claim 4, wherein
the second substrate prepared in the preparing of the second substrate is provided on a glass substrate, and
after the bonding of the first substrate and the second substrate, the glass substrate is removed by laser lift-off from the second substrate.

18. The method according to claim 4, wherein the forming of the subpixel-specific layers and the forming of the nanoparticle layer are performed as a single step.

* * * * *